(12) United States Patent
Umezawa et al.

(10) Patent No.: US 7,312,503 B2
(45) Date of Patent: *Dec. 25, 2007

(54) SEMICONDUCTOR MEMORY DEVICE INCLUDING MOS TRANSISTORS EACH HAVING A FLOATING GATE AND A CONTROL GATE

(75) Inventors: Akira Umezawa, Yokohama (JP); Takehiro Hasegawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 329 days.

This patent is subject to a terminal disclaimer.

(21) Appl. No.: 10/753,324

(22) Filed: Jan. 9, 2004

(65) Prior Publication Data
US 2004/0212023 A1 Oct. 28, 2004

(30) Foreign Application Priority Data
Apr. 25, 2003 (JP) ............................... 2003-122342

(51) Int. Cl.
  *H01L 29/76* (2006.01)
  *H01L 31/062* (2006.01)
(52) U.S. Cl. ...................... 257/390; 257/391; 257/315; 257/E21.689; 257/E21.691; 257/316; 365/185.05; 365/185.13
(58) Field of Classification Search ................ 287/388, 287/390, 391, 392, 314, 315, 316, 321
See application file for complete search history.

(56) References Cited

U.S. PATENT DOCUMENTS 5,818,761 A * 10/1998 Onakado et al. ....... 365/185.18
6,222,774 B1 4/2001 Tanzawa et al.
6,256,227 B1 7/2001 Atsumi et al.

FOREIGN PATENT DOCUMENTS

KR 1999-0048773 7/1999

OTHER PUBLICATIONS

Wei-Hua Liu et al., A 2-Transistor Source-select (2TS) Flash EEPROM for 1.8V-Only Applications, Non-volatile Semiconductor Memory Workshop 4.1, 1997.
U.S. Appl. No. 10/753,324, filed Jan. 9, 2004, Umezawa et al.
U.S. Appl. No. 11/733,796, filed Apr. 11, 2007, Kanda et al.

* cited by examiner

*Primary Examiner*—Sue A. Purvis
*Assistant Examiner*—Fazli Erdem
(74) *Attorney, Agent, or Firm*—Oblon, Spivak, McClelland, Maier & Neustadt, P.C.

(57) ABSTRACT

A semiconductor memory device includes a plurality of memory cells, a plurality of local bit lines, a global bit line, a first switch element, and a holding circuit. The memory cell includes first and second MOS transistors. The first MOS transistor has a charge accumulation layer and a control gate. The second MOS transistor has one end of its current path connected to one end of a current path of the first MOS transistor. The local bit line connects other end of the current paths of the first MOS transistors. The first switch element makes a connection between the local bit lines and the global bit line. The holding circuit is connected to the global bit line and holds data to be written into the memory cells.

36 Claims, 16 Drawing Sheets

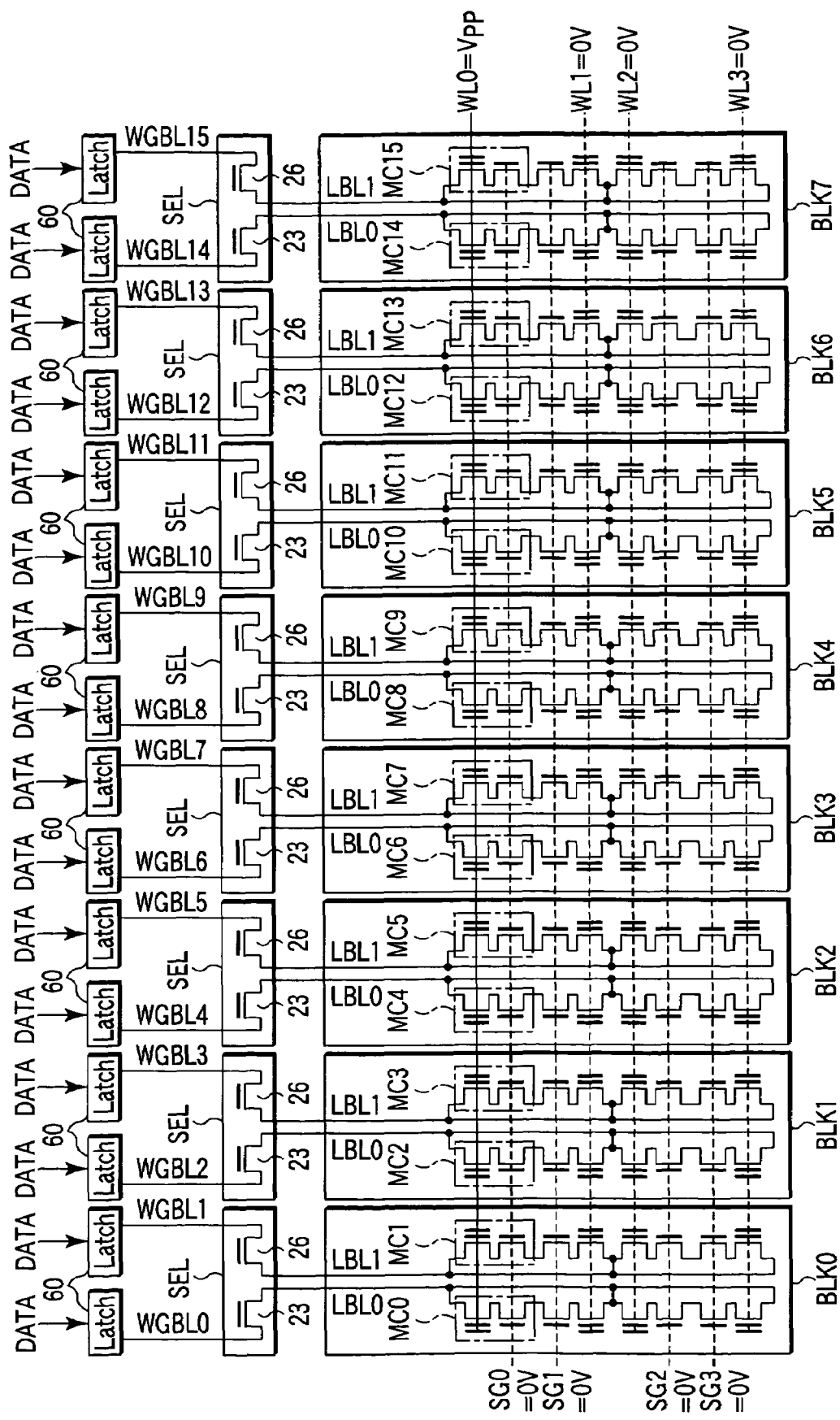
F I G. 4A

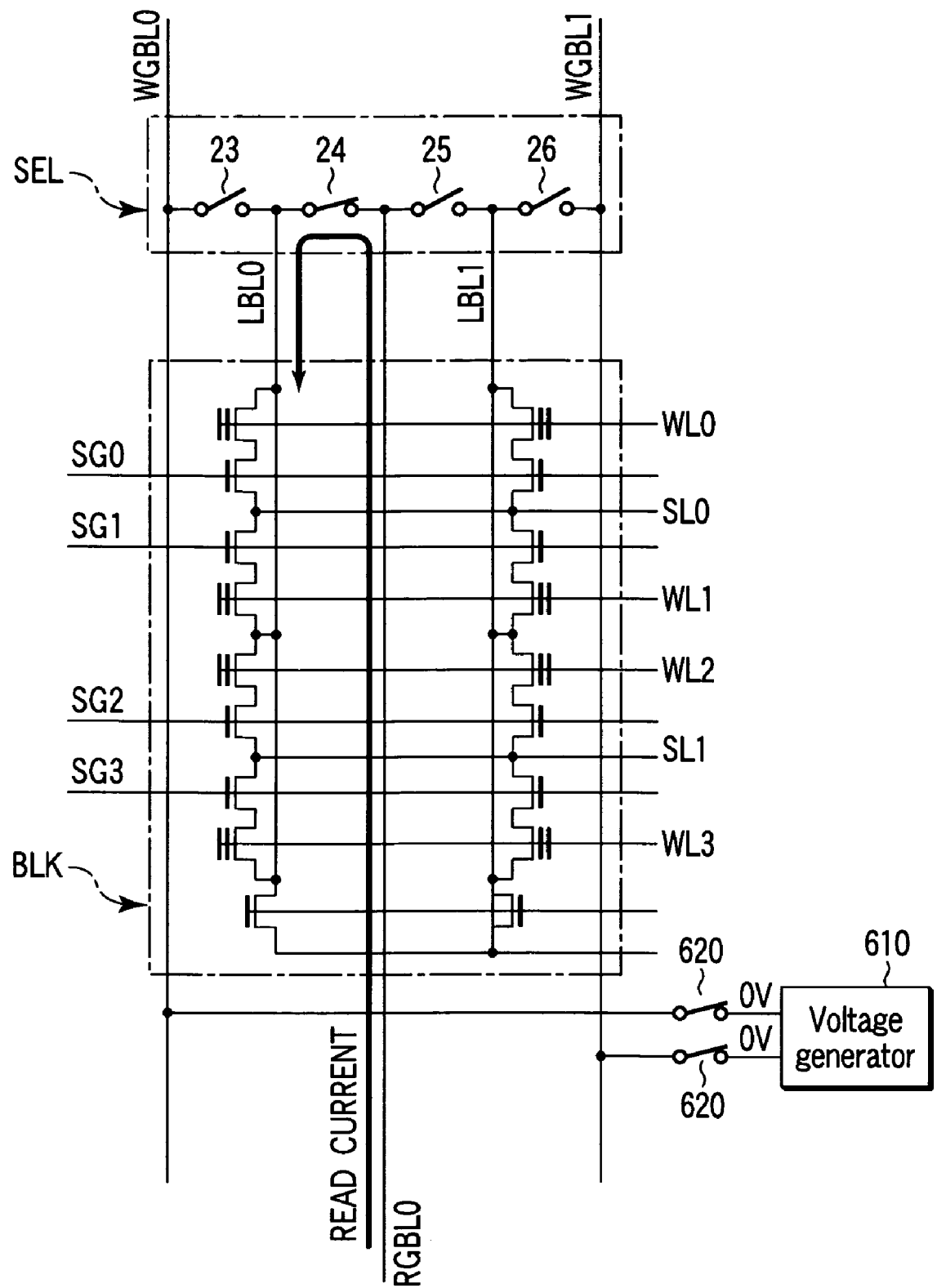
F I G. 12

SEMICONDUCTOR MEMORY DEVICE INCLUDING MOS TRANSISTORS EACH HAVING A FLOATING GATE AND A CONTROL GATE

CROSS-REFERENCE TO RELATED APPLICATIONS

This application is based upon and claims the benefit of priority from the prior Japanese Patent Application No. 2003-122342, filed Apr. 25, 2003, the entire contents of which are incorporated herein by reference.

BACKGROUND OF THE INVENTION

1. Field of the Invention

This invention relates to a semiconductor memory device. More particularly, this invention relates to a nonvolatile semiconductor memory device including MOS transistors each having a floating gate and a control gate.

2. Description of the Related Art

Nonvolatile semiconductor memories, including NOR flash memories and NAND flash memories, have been widely used.

In recent years, a flash memory combining the best features of a NOR flash memory and a NAND flash memory has been proposed in, for example, Wei-Hua Liu, "A 2-Transistor Source-select (2TS) Flash EEPROM for 1.8-V-Only Application," Non-Volatile Semiconductor Memory Workshop 4.1, 1997. This flash memory has a memory cell including two MOS transistors. In such a memory cell, one MOS transistor functioning as a nonvolatile memory section has a structure including a control gate and a floating gate and is connected to a bit line. The other MOS transistor, which is connected to a source line, is used to select a memory cell. However, with the conventional flash memory described in the literature, the operating speed is sometimes insufficient. Particularly, the reading speed is liable to decrease.

BRIEF SUMMARY OF THE INVENTION

A semiconductor memory device according to an aspect of the present invention comprises: a plurality of memory cells each of which includes a first MOS transistor with a charge accumulation layer and a control gate and a second MOS transistor which has one end of its current path connected to one end of a current path of the first MOS transistor; a plurality of local bit lines each of which connects other ends of the current paths of the first MOS transistors; a global bit line to which two or more of the local bit lines are connected in common; a first switch element which makes a connection between the local bit lines and the global bit line; and a holding circuit which is connected to the global bit line and holds data to be written into the memory cells.

BRIEF DESCRIPTION OF THE SEVERAL VIEWS OF THE DRAWING

FIG. 4A is a circuit diagram of a part of the flash memory according to the first embodiment, which helps explain a write operation;

FIG. 12 is a circuit diagram of a memory cell block and a selector included in a flash memory according to a modification of the first and second embodiments.

DETAILED DESCRIPTION OF THE INVENTION

A nonvolatile semiconductor memory device according to a first embodiment of the present invention will be explained by reference to FIG. 1.

Figure 1:
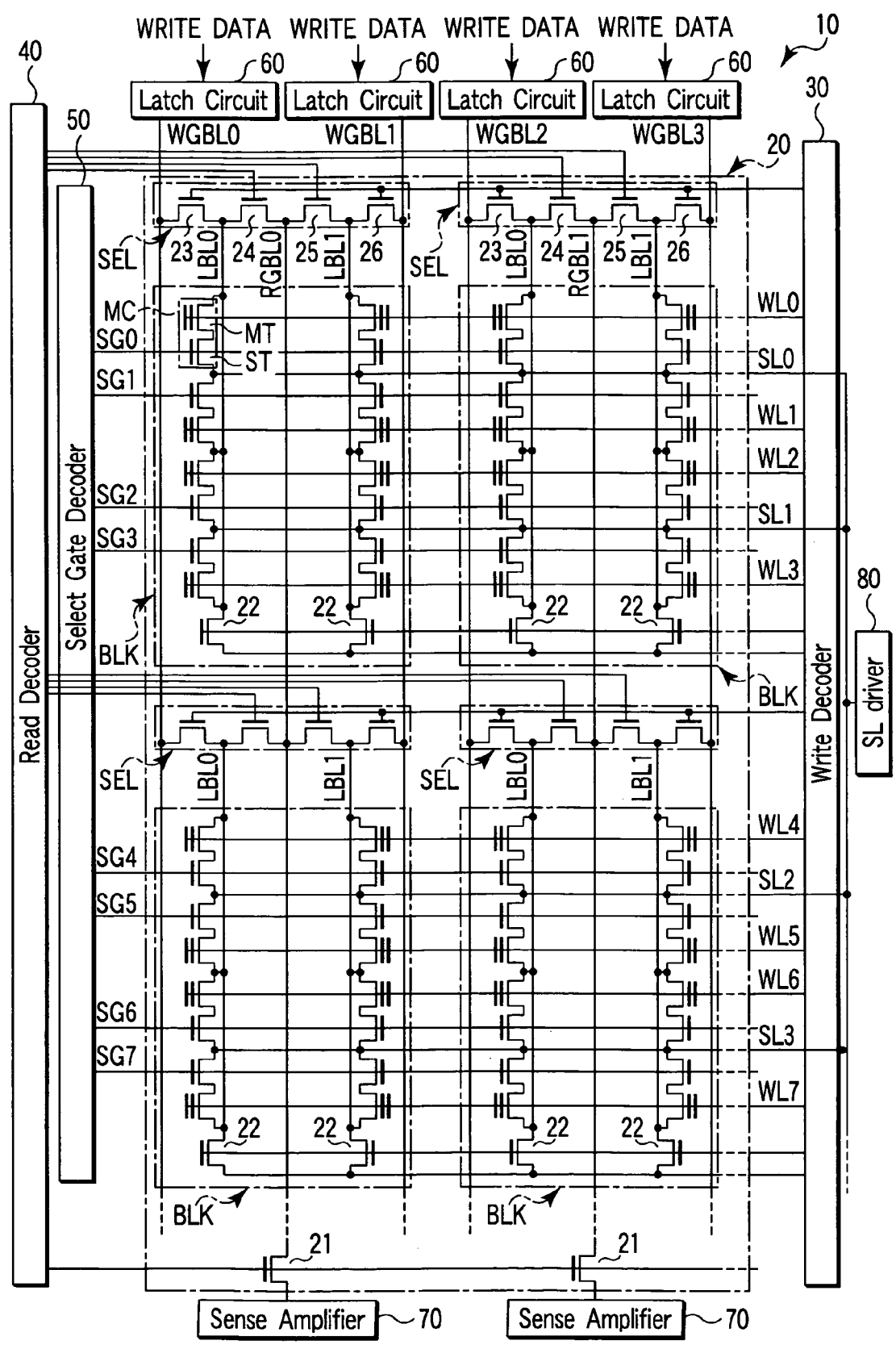
FIG. 1 is a block diagram of a flash memory according to a first embodiment of the present invention.

FIG. 1 is a block diagram of a flash memory according to the first embodiment.

As shown in FIG. 1, a flash memory 10 comprises a memory cell array 20, a write decoder 30, a read decoder 40, a select gate decoder 50, latch circuits 60, sense amplifiers 70, and a source line driver 80.

The memory cell array 20 has (m+1)×(n+1) memory cell blocks BLKs (where m and n are natural numbers), selectors SELs provided for the memory cell blocks BLKs in a one-to-one correspondence, and MOS transistors 21. While in FIG. 1, only (2×2) memory cell blocks BLKs are shown, the embodiment is not limited to this number.

Each memory cell block includes a plurality of memory cells MCs. A memory cell MC has a memory cell transistor MT and a select transistor ST whose current paths are connected in series with each other. The memory cell transistor MT has a stacked gate structure including a floating gate formed on a semiconductor substrate with a gate insulating film interposed therebetween and a control gate formed above the floating gate with an inter-gate insulating film interposed therebetween. The source region of the memory cell transistor MT is connected to the drain region of the select transistor ST. Each memory cell block includes (4×2) memory cells of this configuration. The number of memory cells MCs arranged in the direction of column, or the column direction, is four in FIG. 1. The number of memory cells is illustrative and not restrictive, and may be, for example, 8 or 16. Memory cells MCs adjacent to each other in the column direction share the source region of the select transistor ST or the drain region of the memory cell transistor MT. The drain regions of the memory cell transistors MT of the memory cells in two columns are connected to two local bit lines LBL0, LBL1 in a one-to-one correspondence. On end of each of the local bit lines LBL0, LBL1 is connected to a selector SEL. The other ends of the local bit lines LBL0, LBL1 are connected to a write decoder 30 via the current paths of MOS transistors 22. Furthermore, in the memory cell array 20, the control gates of the memory cell transistors MTs in the same row are connected in common to any one of the word lines WL0 to WL(4m−1). The gates of the select transistors STs in the same row are connected in common to any one of the select gate lines SG0 to SG(4m−1). The local bit lines LBL0, LBL1 are connected equally to the memory cell transistors in each memory cell block BLK, whereas the word line WL and select gate line SG are connected equally to the memory cell transistors and select transistors in the same row from one memory cell block to another. The word lines WL0 to WL(4m−1) are connected to the write decoder 30. The select gate lines SG0 to SG(4m−1) are connected to the select gate decoder 50. The source regions of the select transistors STs are connected in common in a plurality of memory cell blocks BLKs and then are connected to the source line driver 80.

Next, the configuration of a selector SEL will be explained. Each selector SEL includes four MOS transistors 23 to 26 connected in series. Specifically, one end of the current path of the MOS transistor 23 is connected to one end of the current path of the MOS transistor 24. The other end of the current path of the MOS transistor 24 is connected to one end of the current path of the MOS transistor 25. The other end of the current path of the MOS transistor 25 is connected to one end of the current path of the MOS transistor 26. The gates of the MOS transistors 23, 26 are connected to the write decoder 30. The gates of the MOS transistors 24, 25 are connected to the read decoder 40. Then, the local bit line LBL0 of the corresponding memory cell block BLK is connected to the connection node of the MOS transistor 23 and MOS transistor 24. The local bit line LBL1 of the corresponding memory cell block BLK is connected to the connection node of the MOS transistor 25 and MOS transistor 26. Furthermore, the other ends of the MOS transistors 23, 26 of the selector are connected to any of the write global bit lines WGBL0 to WGBL(2n−1). Each of the write global bit lines WGBL0 to WGBL(2n−1) is connected equally to the other ends of the current paths of the MOS transistors 23 or MOS transistors 26 of the selectors in the same column. Then, one end of each of the write global bit lines WGBL0 to WGBL(2n−1) is connected to a latch circuit 60 provided for each write global bit line. Read global bit lines RGBL0 to RGBL(n−1) are connected to the connection nodes of the MOS transistors 24 and MOS transistors 25. Each of the read global bit lines RGBL0 to RGBL(n−1) is connected equally to the connection nodes of the MOS transistors 24 and MOS transistors 25 of the selectors SEL in the same column. Then, one end of each of the read global bit lines RGBL0 to RGBL(n−1) is connected to a sense amplifier 70 via the current path of the corresponding MOS transistor 21. The gate of each MOS transistor 21 is connected in common and is connected to the read decoder 40.

The configuration of the memory cell array 20 will also be explained as follows. In the memory cell array 20, a plurality of memory cells MCs are arranged in a matrix. The control gates of the memory cell transistors MTs of the memory cells MCs in the same row are connected in common to any of the word lines WL0 to WL(4m−1). The gates of the select transistors of the memory cells in the same row are connected to any of the select gate lines SG0 to SG(4m−1). The drains of the memory cell transistors MTs of four memory cells MCs connected in series in the same column are connected in common to one of the local bit lines LBL0, LBL1. That is, a plurality of memory cells MCs in the memory cell array 20 are connected to a different local bit line in units of four memory cells MCs arranged in a column. Then, one end of each of the local bit lines in the same row is connected to one another via a MOS transistor 22 and is connected to the write decoder 30. The other ends of the local bit lines LBL0, LBL1 in the same column are connected via the MOS transistors 23, 26, respectively, to any of the write global bit lines WGBL0 to WGBL(2n−1). The other ends of the local bit lines LBL0, LBL1 in the same column are connected via the MOS transistors 24, 25, respectively, to any of the read global bit lines RGBL0 to RGBL(n−1). The sources of the select transistors STs of the memory cells MCs are connected in common to one another and are connected to the source line driver 80. In the memory cell array configured as described above, two columns of four memory cells MCs connected to the same local bit line form one memory cell block BLK. The memory cell blocks in the same column are connected in common to any of the write global bit line and any of the read global bit line. On the other hand, the memory cell blocks in a different column are connected to any of the write global bit line and any of the read global bit line.

The write decoder 30 selects any one of the word lines WL0 to WL(4m−1) and supplies a voltage to the selected word line in a write operation. The write decoder 30 also supplies a voltage to the gates of the MOS transistors 23, 26 in the selector SEL. Furthermore, the write decoder 30 supplies a voltage to the gate of the MOS transistor 22 and the common connection node of the local bit lines.

The read decoder 40 selects any one of the MOS transistors 24, 25 in the selector SEL and supplies a voltage to the gate of the selected MOS transistor in a read operation. The read decoder 40 also supplies a voltage to the gate of the MOS transistor 21.

The select gate decoder 50 selects any one of the select gate lines SG0 to ST(4m−1) and supplies a voltage to the selected gate line.

The latch circuit 60 latches write data.

The sense amplifier 70 amplifies read-out data.

The source line driver 80 supplies a voltage to a source line.

Figure 2:
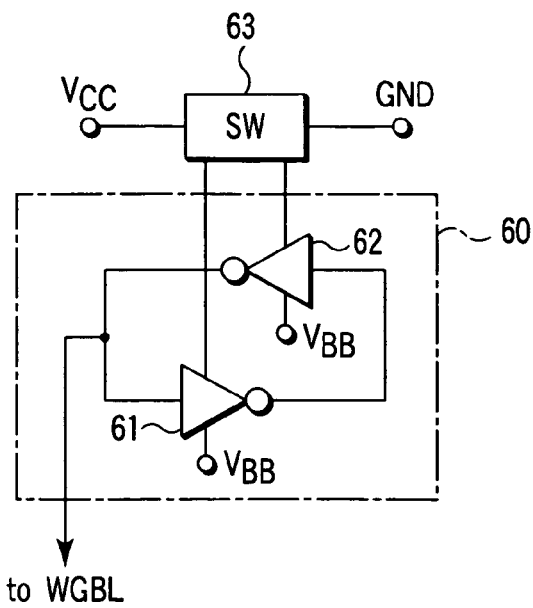
FIG. 2 is a circuit diagram of a latch circuit included in the flash memory of the first embodiment.

FIG. 2 is a circuit diagram showing a configuration of the latch circuit 60, an example of which is a holding circuit. As shown in FIG. 2, the latch circuit 60 has two inverters 61, 62. The input terminal of the inverter 61 is connected to the output terminal of the inverter 62. The output terminal of the inverter 61 is connected to the input terminal of the inverter 62. The connection node of the input terminal of the inverter 61 and the output terminal of the inverter 62 is connected to a write global bit line. The power supply voltage for the inverters 61, 62 is VBB (for example, −8 V) and Vcc (for example, 1.5 V) or GND. Whether the high-voltage side of the power supply voltage is Vcc or GND is determined by a switch element 63.

Figure 3B:
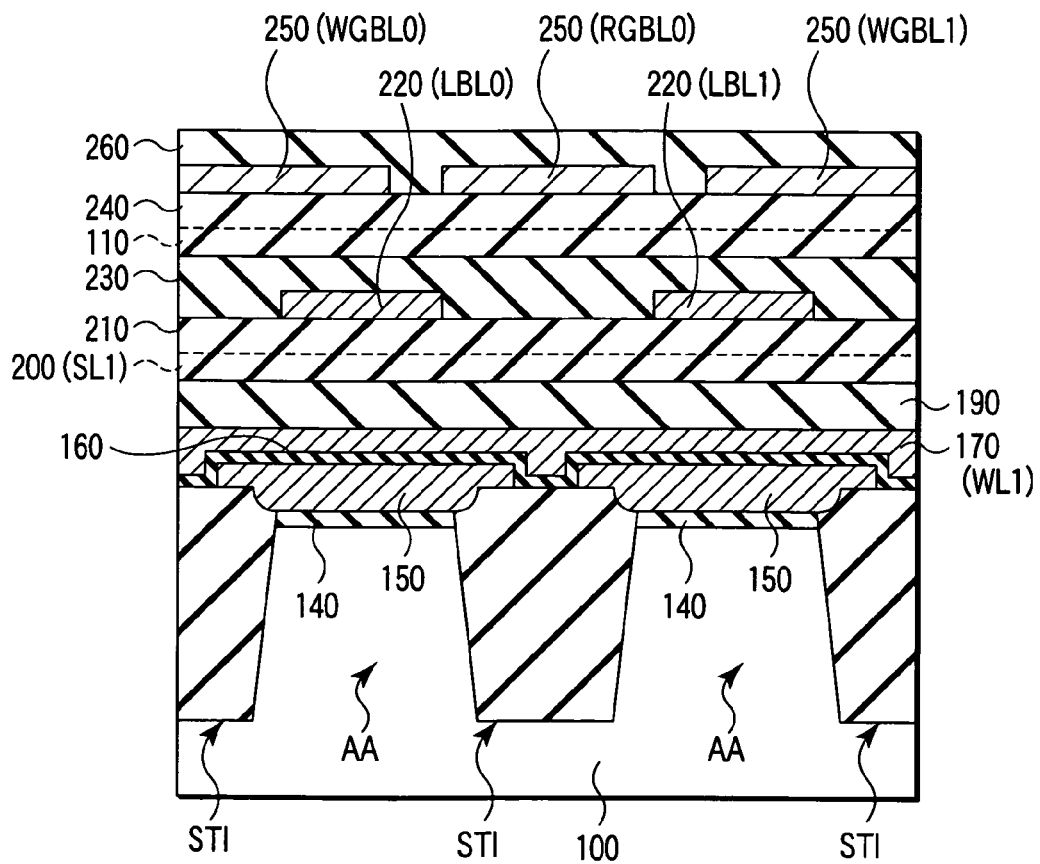
FIG. 3B is a sectional view taken along line 3B-3B of FIG. 3A.
Figure 3A:
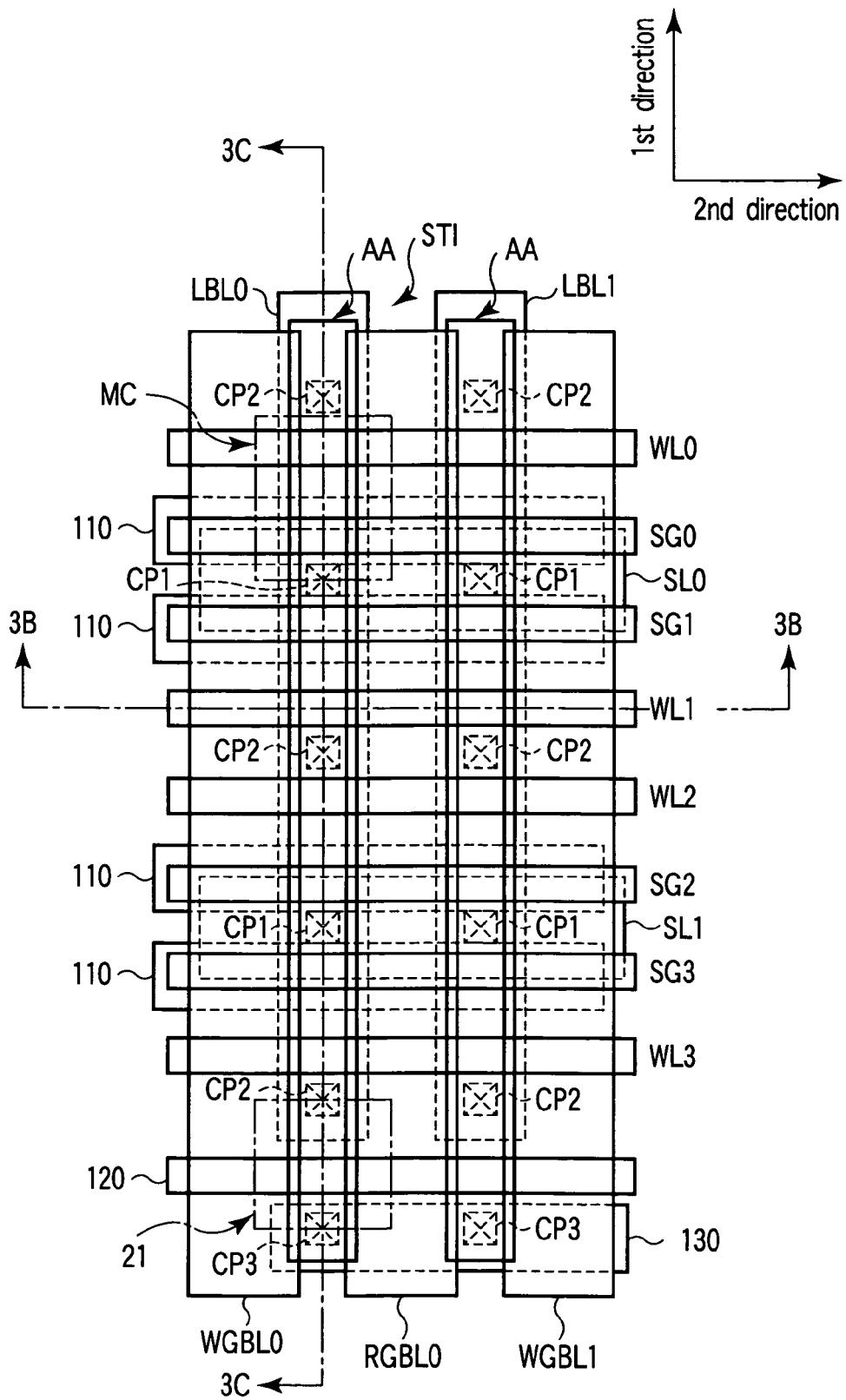
FIG. 3A is a plan view of a memory cell block included in the flash memory of the first embodiment.

Next, a plane pattern of the memory cell array included in the flash memory of FIG. 1 will be explained. FIG. 3A is a plan view of a memory cell block BLK connected to the write global bit lines WGBL0, WGBL1 and word lines WL0 to WL3 in FIG. 1.

As shown in FIG. 3A, a plurality of stripe-shaped element regions AAs extending in a first direction are formed in a semiconductor substrate 100 in a second direction perpendicular to the first direction. Then, stripe-shaped word lines WL0 to WL3 and select gate lines SG0 to SG3 extending in the second direction are formed in such a manner that they cross two of the element regions AAs. Of course, these word lines WL0 to WL3 and select gate lines SG0 to SG3 are connected in common in a plurality of memory cell blocks (not shown) adjacent to one another in the second direction. In the regions where the word lines WL0 to WL3 and the element regions AAs cross one another, memory cell transistors MTs (not shown) are formed. In the regions where the select gate lines SG0 to SG3 and the element regions AAs cross one another, select transistors STs (not shown) are formed. In the regions where the word lines WL0 to W13 and the element regions AAs cross one another, floating gates (not shown) isolated fron one memory cell transistor MT from another are formed.

On the two select gate lines SG0, SG1 adjacent to each other and the two select gate lines SG2, SG3 adjacent to each other, stripe-shaped source lines SL0, SL1 extending in the second direction are formed. The source lines SL0, SL1 and the source regions of the select transistors STs are connected electrically by contact plugs CP1. Stripe-shaped local bit lines LBL0, LBL1 extending in the first direction are formed in such a manner that they almost overlap with the element regions AAs. One end of each of the local bit lines LBL0, LBL1 is connected to the selector SEL corresponding to the memory cell block BLK. The other ends of the local bit lines LBL0, LBL1 are located at the top of the memory cell transistor MT (or the memory cell transistor connected to the word line WL3) farthest from the selector. The local bit lines LBL0, LBL1 are connected to the drain region of each memory cell transistor MT via a contact plug CP2. In the region just above each of the select gate lines SG0 to SG3, a stripe-shaped metal wiring layer 110 extending in the second direction is formed. The metal wiring layer 110, which functions as shunt wiring for the select gate lines SG0 to SG3, is connected via contact plugs to the select gate lines SG0 to SG3 in regions (not shown). In the position farthest from the corresponding selector SEL, the gate electrode 120 of the MOS transistor 21 is so formed that it is shaped like a stripe extending in the second direction. Then, the source region of the MOS transistor is connected to a metal wiring layer 130 via a contact plug CP3. The source regions of the MOS transistors 21 in the same row are connected in common to the metal wiring layer 130. Furthermore, in a layer above the wiring layer, three stripe-shaped metal wiring layers extending in the first direction are formed. These three metal wiring layers are two write global bit liens WGBL0, WGBL1, and a read global bit line RGBL0 sandwiched between the write global bit lines.

Figure 3C:
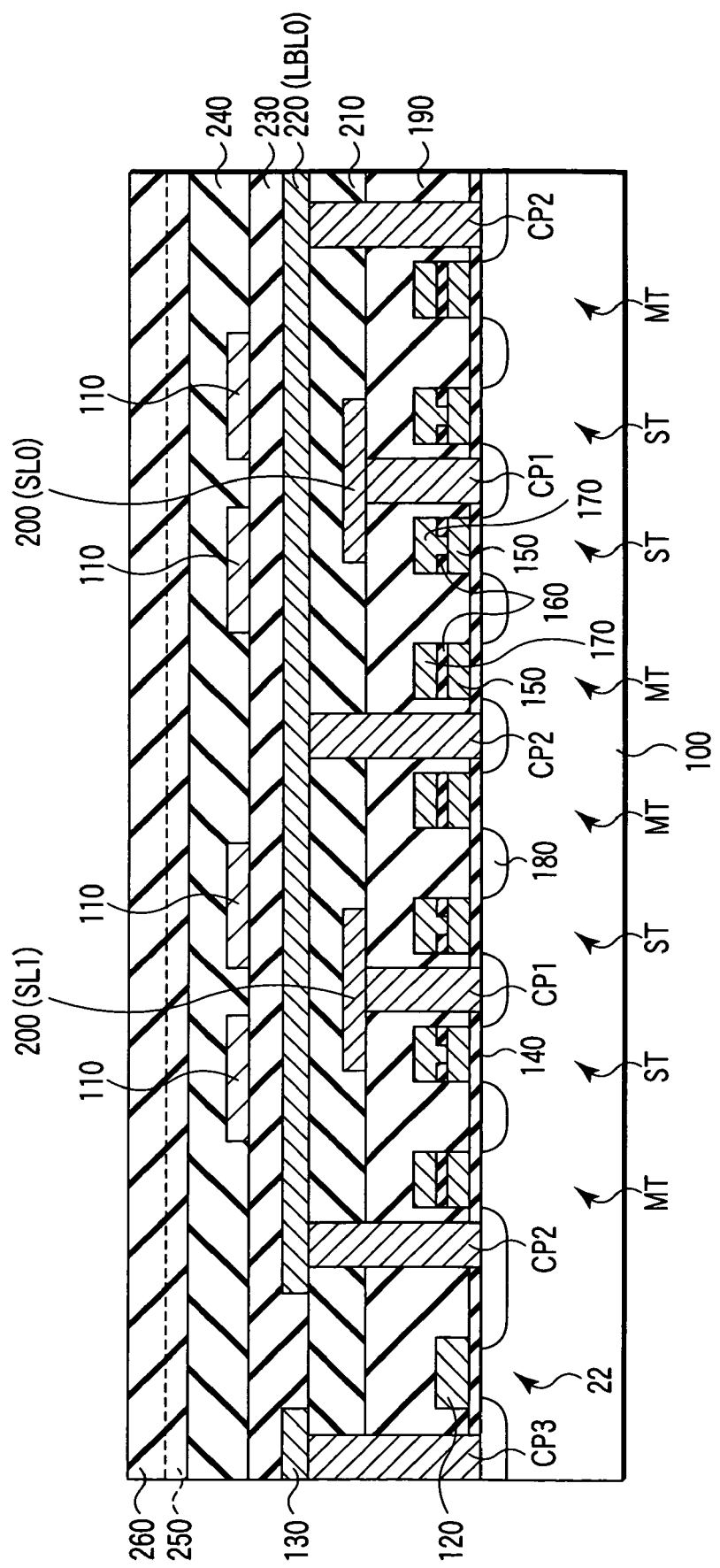
FIG. 3C is a sectional view taken along line 3C-3C of FIG. 3A.

Next, a sectional structure of the memory cell block BLK will be explained by reference to FIGS. 3B and 3C. FIG. 3B is a sectional view taken along line 3B-3B of FIG. 3A. FIG. 3C is a sectional view taken along line 3C-3C of FIG. 3A.

As shown in the figures, element isolating regions STIs are formed in the semiconductor substrate 100. Regions enclosed by the element isolating regions STIs are element regions AAs. A gate insulating film 140 is formed on an element region AA in the semiconductor substrate 100. The gate electrodes of a memory cell transistor MT and a select transistor ST are formed on the gate insulating film 140. The gate electrodes of the memory cell transistor MT and select transistor ST include a polycrystalline silicon layer 150 formed on the gate insulating film 140, an inter-gate insulating film 160 formed on the polycrystalline silicon layer 150, and a polycrystalline silicon layer 170 formed on the inter-gate insulating film 160. The inter-gate insulating film 160 is made of, for example, a silicon oxide film, or a film with a stacked structure of a silicon oxide film and a silicon nitride film, that is an ON film, an NO film, or an ONO film. As shown in FIG. 3B, the polycrystalline silicon layer 150, which is isolated from another between adjacent element regions AAs, functions as a floating gate in the memory cell transistor MT. The polycrystalline silicon layer 170, which also functions as a control gate, is connected to a word line WL. Then, the polycrystalline silicon layer 170 is connected equally to adjacent element regions AAs. In the select transistor ST, a part of the inter-gate insulating film 160 is removed and the polycrystalline silicon layers 150, 170 are electrically connected. Then, the polycrystalline silicon layers 150, 170 are connected to a select gate line SG. In the select transistor ST, too, the polycrystalline silicon layer 170 is connected equally to adjacent element regions AAs. Then, an impurity diffused layer 180 is formed in the surface of the semiconductor substrate 100 located between adjacent gate electrodes. The impurity diffused layer 180 is shared by adjacent transistors. On the semiconductor substrate 100, the gate electrode 120 of the MOS transistor 22 is formed in the position farthest from the selector SEL.

Memory cells MCs including memory cell transistors MTs and select transistors STs are formed so as to have the following relationship. Adjacent memory cells MC, MC have their select transistors STs adjacent to each other and their memory cell transistors MTs adjacent to each other. They share an impurity diffused layer. Thus, when the select transistors STs are adjacent to each other, the two adjacent memory cells MC, MC are arranged symmetrically, centering on the impurity diffused layer 180 shared by the two select transistors. ST, ST. Conversely, when the memory cell transistors MTs are adjacent to each other, the two adjacent memory cells MC, MC are arrange symmetrically, centering on the impurity diffused layer 180 shared by the two memory cell transistors MT, MT.

Then, an interlayer insulating film 190 is formed on the semiconductor substrate 100 so as to cover the memory cell transistors MTs, select transistors STs, and MOS transistors 22. A contact plug CP1 reaching the impurity diffused layer (source region) 180 shared by two select transistors ST, ST is formed in the interlayer insulating film 190. Then, a metal wiring layer 200 connected to the contact plug CP1 is formed on the interlayer insulating film 190. The metal wiring layer 200 functions as a source line SL.

An interlayer insulating film 210 is formed on the interlayer insulating film 190 so as to cover the metal wiring layer 200. Then, a contact plug CP2 is formed in such a manner that it extends from the surface of the interlayer insulating film 210, penetrates the interlayer insulating film 210 and the interlayer insulating film 190, and reaches the impurity diffused layer (drain region) 180 of the memory cell transistor MT. Furthermore, a contact plug CP3 shaped like the contact plug CP2 is formed so that it reaches the impurity diffused layer 180 (source region) of the MOS transistor 22. Then, a metal wiring layer 220 connected equally to a plurality of contact plugs CP2 is formed on the interlayer insulating film 210. The metal wiring layer 220 functions as local bit lines LBL0, LBL1. One end of the metal wiring layer 220 is connected to a contact plug CP2 closest to the MOS transistor 22 in the same element region AA. The other end of the metal wiring layer 220 is connected to the selector SEL (not shown). A metal wiring layer 130 connected to the contact plug CP3 is formed on the interlayer insulating film 210. Of course, the metal wiring layer 130 is isolated from the metal wiring layer 220.

An interlayer insulating film 230 is formed on the interlayer insulating film 210 so as to cover the metal wiring layers 220, 130. A metal wiring layer 110 is formed on the interlayer insulating film 230. The metal wiring layer 110 functions as shunt wiring for the gates of the select transistors STs. Thus, in the region (not shown), a contact hole is made in such a manner that it extends from the surface of the interlayer insulating film 230 and reach the gate electrode 170 of the select transistor ST. The gate electrode 170 of the select transistor ST and the metal wiring layer 110 are connected electrically through the contact hole.

An interlayer insulating film 240 is formed on the interlayer insulating film 230 so as to cover the metal wiring layer 110. A metal wiring layer 250 is formed on the interlayer insulating film 240. The metal wiring layer 250 functions as read global bit line RGBL0 and write global bit lines WGBL0, WGBL1. An interlayer insulating film 260 is formed on the interlayer insulating film 240 so as to cover the metal wiring layer 250.

Next, the operation of the flash memory configured as described above will be explained.

<Write Operation>

The data is written simultaneously into all of the memory cells connected to any one of the word lines. Then, "0" data or "1" data is written, depending on whether electrons are injected into the floating gate of a memory cell transistor MT. Electrons are injected into the floating gate by Fowler-Nordheim (FN) tunneling.

In FIG. 1, when write data ("1" or "0") is inputted from the I/O terminal (not shown), the write data is inputted to each latch circuit 60. If "1" data is stored in the latch circuit 60, the output of the latch circuit 60 goes high, that is, goes to 0 V. Conversely, if "0" data is stored, the output of the latch circuit 60 goes low, that is, goes to VBB (−8 V). These voltages are applied to the corresponding write global bit line WGBL.

Then, the write decoder 30 selects any one of the word lines WL0 to WL(4m−1) and turns off the MOS transistors 22. Vpp (for example, 12,V) is applied to the selected word line. The select gate decoder 50 brings the select gate lines SG0 to SG(4m−1) into the low level (0 V or VBB). Thus, all of the select transistors are turned off.

Furthermore, the write decoder 30 turns on the MOS transistors 23, 26 in the selector SEL corresponding to the memory cell block BLK including the selected word line. As a result, the write global bit line WGBL and the local bit line LBL are connected electrically. The MOS transistors 23, 26 in the selector SEL corresponding to the memory cell block BLK not including the select word line are turned off. On the other hand, the read decoder 40 turns off the MOS transistors 24, 25 in all of the selectors SELs. Thus, the read global bit line RGBL and local bit line LBL are disconnected electrically.

As a result, the write global bit line applies a potential corresponding to "1" data or "0" data to the local bit line LBL of the memory cell block BLK including the selected word line via the MOS transistor 23, 26 in the selector SEL. The potential is applied to the drain region of the memory cell transistor MT via the contact plug CP2 (see FIGS. 3A and 3C). Then, Vpp (12 V) is applied to the selected word line WL, with the result that 0 V is applied to the drain region of the memory cell MC into which "1" data is to be written and VBB (−8 V) is applied to the drain region of the memory cell MC into which "0" data is to be written. Thus, since the potential difference (12 V) between the gate and drain of the memory cell MC into which "1" data is to be written is not sufficient, electrons are not injected into the floating gate, with the result that the memory cell MC holds a negative threshold value. On the other hand, since the potential difference (20 V) between the gate and drain of the memory cell MC into which "0" data is written is large, electrons are injected into the floating gate by FN tunneling. As a result, the threshold value of the memory cell changes to the positive side.

In this way, the data is written into the memory cell. FIG. 4A is a circuit diagram to help explain how the data is written into the memory cell MC connected to word line WL0. There are eight memory cell blocks BLKs along the word line direction. Eight memory cell blocks BLKs including word line WL0 are referred to as BLK0 to BLK7. The memory cells MCs connected to word line WL0 are referred to as MC0 to MC15.

As shown in the figure, the data to be written into the corresponding memory cells MC0 to MC15 is stored in the respective latch circuits 60. When the MOS transistors 23, 26 in the selector SEL are turned on, causing each of the write global bit lines WGGL0 to WGBL15 to be connected to the local bit lines LBL0, LBL1. As a result, the potential (0 V or VBB) corresponding to the write data is applied to the drain regions of the memory cells MC0 to MC15. Since the memory cell blocks except for the memory cell blocks BLK0 to BLK7 are isolated electrically from the write global bit lines WGBL0 to WGBL15, they are invisible to the write global bit lines WGBL0 to WGBL15.

Then, Vpp is applied to word line WL0 and the other word lines WL1 to WL3 are connected to GND. As a result, the data held in the latch circuits 60 is written simultaneously into all of the memory cells MC0 to MC15 connected to word line WL0.

<Read Operation>

In a data read operation, the data can be read simultaneously from a plurality of memory cells connected to any one of the word lines. Then, the data is read from one memory cell MC in each block.

In FIG. 1, the select gate decoder 50 selects any one of the select gate lines SG0 to SG(4m−1). A high level (e.g., Vcc) is applied to the selected select gate line. A low level (e.g., 0 V) is applied to all of the unselected select gate lines. Thus, the select transistor ST connected to the selected select gate line is turned on, whereas the select transistors STs connected to the unselected select gate lines are turned off. The read decoder 30 not only brings all of the word lines WL0 to WL(4m−1) to the low level but also turns off the MOS transistors 22. The source line driver 80 sets the potential of the source line at 0 V.

The read decoder 40 turns on one of the MOS transistors 24, 25 in the selector SEL corresponding to the memory cell block BLK including the selected select gate line. As a result, the read global bit lines RGBL0 to RGBL(n−1) are connected to the local bit line LBL0 to LBL1 electrically, provided that the MOS transistors 24, 25 in the selectors SELs corresponding to the memory cell blocks BLKs not including the selected select gate line are turned off. On the other hand, the write decoder 30 turns off the MOS transistors 23, 26 in all of the selectors SELs. Thus, the write global bit line GBL is electrically isolated from the local bit line LBL. Furthermore, the read decoder 40 turns on the MOS transistors 21.

As a result, the local bit line LBL0 or LBL1 is connected to the sense amplifier 70 via MOS transistor 24 or MOS transistor 25 in the selector SEL and the read global bit lines RGBL0 to RGBL(n-1).

Then, for example, about 1 V is applied to the read global bit lines RGGLO to RGBL(n-1). Then, since the memory cell transistor MT of the memory cell MC into which "1" data has been written has a negative threshold voltage, it goes on. Thus, in the memory cell MC connected to the selected select gate line, current flows from the read global bit line RGBL to the source line SL via the local bit line LBL, memory cell transistor MT, and select transistor ST. On the other hand, since the memory cell transistor MT of the memory cell MC into which "0" data has been written has a positive threshold voltage, it is in the off state. Thus, no current flows through the read global bit line RGBL.

In this way, the potential of read global bit line RGBL varies. The sense amplifier 70 amplifies the variation, thereby carrying out the read operation.

Figure 4B:
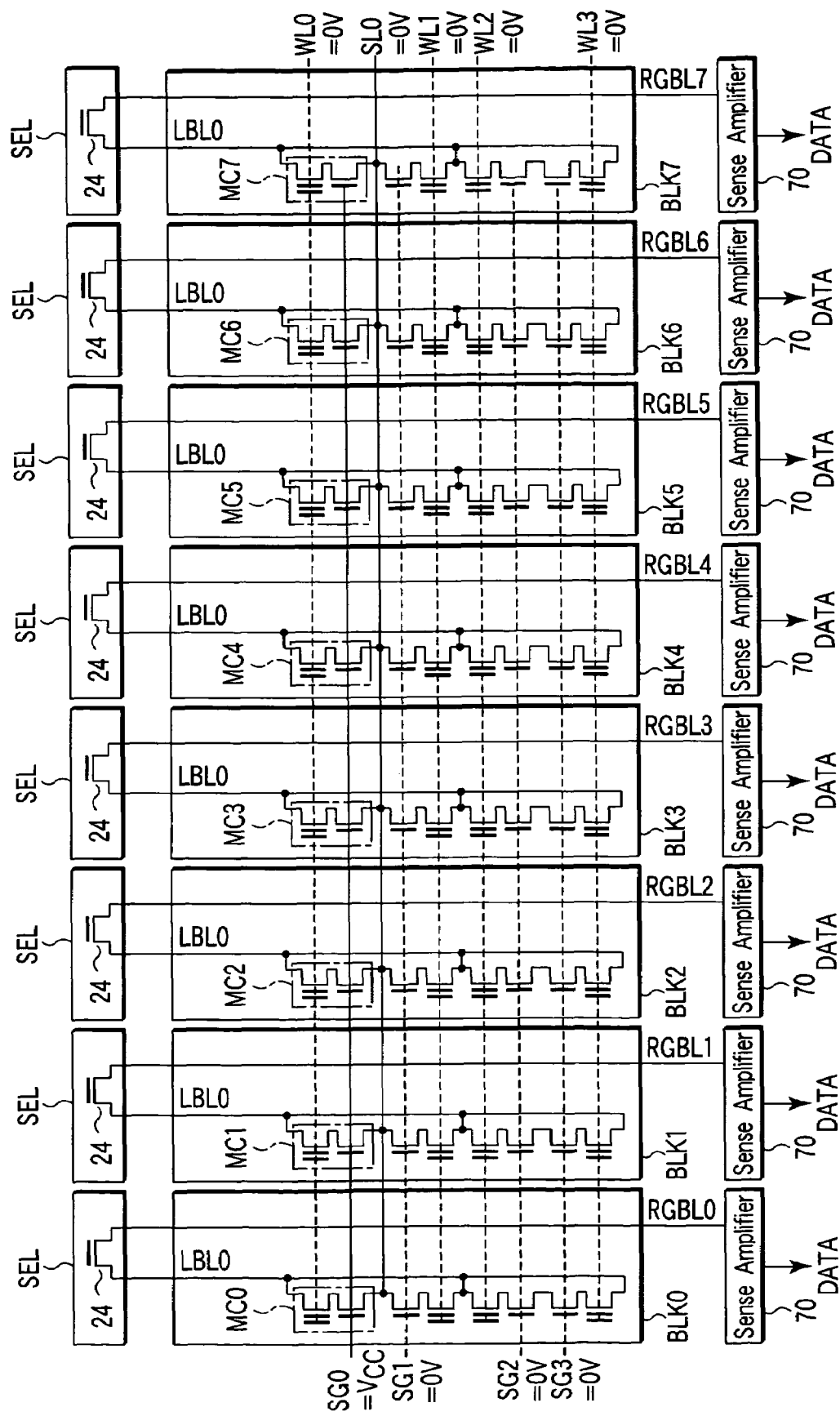
FIG. 4B is a circuit diagram of a part of the flash memory according to the first embodiment, which helps explain a read operation.

FIG. 4B is a circuit diagram to help explain how the data is read from the memory cell MC connected to word line WL0 and local bit line LBL0. There are eight memory cell blocks BLKs along the word line direction.

Eight memory cell blocks BLKs including word line WL0 are referred to as BLK0 to BLK7. The memory cells MCs connected to word line WL0 and local bit line LBL0 are referred to as MC0 to MC7.

As shown in the figure, when the MOS transistor 24 in the selector SEL is turned on, each of the read global bit lines RGBL0 to RGBL7 is connected to local bit line LBL0. Then, a potential of about 1 V is applied to the read global bit lines RGBL0 to RGBL7.

Since the memory cell blocks excluding the memory cell blocks BLK0 to BLK7 are isolated electrically from the read global bit lines RGBL0 to RGBL7, they are 2.0 invisible to the read global bit lines RGBL0 to RGBL7.

Furthermore, in the memory cell blocks BLK0 to BLK7, since the local bit line LBL1 is isolated electrically from the read global bit lines RGBL0 to RGBL7, the memory cell MC connected to local bit line LBL1 are invisible to the read global bit lines RGBL0 to RGBL7.

Then, the high level is applied to select gate line SG0 and the other select gate lines SG1 to SG3 are brought to the low level. Of the memory cell blocks BLK0 to BLK7, current flows through the read global bit line RGBL connected to the memory cell in which "1" data has been written, causing the potential to drop. On the other hand, no current flows through the read global bit line RGBL connected to the memory cell in which "0" data has been written, causing the potential to remain unchanged. As a result, the data is read simultaneously from all of the memory cells MC0 to MC7 connected to word line WL0 and local bit line LBL0.

In the above example, the case where the data is read from the memory cell connected to local bit line LBL0 has been explained. In a case where the data is read from the memory cell connected to local bit line LBL1, the MOS transistor 25 in the selector SEL is turned on and the MOS transistor 24 is turned off.

<Erase Operation>

The data is erased simultaneously from all the memory cells sharing a well region. Thus, in the example of FIG. 1, all the memory cells included in the memory cell array 20 are erased at the same time.

In FIG. 1, the write decoder 30 places the potentials of all the word lines WL0 to WL(4m-1) at VBB (-8 V). The potential of the semiconductor substrate (well region) is set at Vpp (20 V). As a result, electrons are taken out from the floating gates of the memory cell transistors of the memory cells into the semiconductor substrate by FN tunneling. As a result, the threshold voltages of all the memory cells MCs become negative, thereby erasing the data.

As described above, the flash memory of the first embodiment produces the following effects:

(1) The operating speed of the flash memory can be improved.

With the configuration of the first embodiment, the bit lines are organized into local bit lines and global bit lines (read global bit lines and write global bit lines) in hierarchical form. Specifically, a plurality of memory cells are connected to each of the local bit lines and a plurality of local bit lines are connected to each of the global bit lines. In the example of FIG. 1, (m-1) local bit lines LBL0s or LBL1s are connected via selectors SELs to one write global bit line WGBL. Then, four memory cells are connected to each of the (m-1) local bit lines LBLs. Furthermore, 2(m-1) local bit lines LBL0s, LBL1s are connected via selectors SEL to one read global bit line RGBL. Then, four memory cells are connected to each of the 2(m-1) local bit lines LBL0, LBL1.

In a write operation, only the local bit line LBL connected to the selected memory cell is connected to the write global bit line WGBL. The local bit lines LBLs to which the selected memory cell is not connected are isolated electrically from the write global bit lines WGBL by the selectors SELs. Thus, as explained in FIG. 4A, only four memory cells including the selected memory cell are visible to one write global bit line WGBL. All of the unselected memory cells which are in the same column as that of the selected memory cell and are connected to a different local bit line LBL are invisible to the write global bit line WGBL. For example, in FIG. 1, suppose the memory cell array 20 includes eight memory cell blocks BLKs per column. If the bit lines are not organized in hierarchical form and all the local bit lines in the same column are connected in common to one another and is connected to a latch circuit, the number of memory cells visible to the local bit lines is four per memory cell block, with the result that the total number of memory cells visible to the local bit lines is (4×8)=32. In the first embodiment, only one of the eight memory blocks BLKs is connected to the global bit line. That is, the number of memory cells visible to the global bit line is only four, which is ⅛ of the number described above. That is, only these four memory cells MC contribute to parasitic capacitance in the write global-bit lines WGBL. The unselected memory cells which are in the same column as that of the selected memory cell and are connected to a different local bit line LBL do not contribute to parasitic capacitance in the write global bit lines. Thus, it is possible to reduce the parasitic capacitance in the write global bit lines remarkably.

The same holds true in a read operation. In a read operation, only the local bit line LBL connected to the selected memory cell is connected to the read global bit line RGBL. The local bit lines LBLs to which the selected memory cell is not connected are isolated electrically from the read global bit lines RGBLs by the selector. Furthermore, only one of the two local bit lines LBL0, LBL1 existing in one memory cell block BLK is actually connected to the read global bit line RGBL. Thus, as explained in FIG. 4B, only four memory cells including the selected memory cell are visible to one read global bit line RGBL. All of the unselected memory cells which are in the same column as that of the selected memory cell and are connected to a different local bit line LBL are invisible to the read global bit line RGBL. Furthermore, in one memory cell block, the memory cells MCs connected to one of the two local bit lines connected to the selected memory cell are invisible to the read global bit line. For instance, as explained in the write operation, suppose the memory cell 20 includes eight memory cell blocks BLKs per column. If all the local bit lines in the same row are connected in common to one another and are connected to a sense amplifier, the number of memory cells visible to the local bit lines is four per memory cell block, with the result that the total number of memory cells visible to the local bit lines is (4×8)=32. In the first embodiment, only one of the eight memory blocks BLKs is connected to the global bit line. That is, the number of memory cells visible to the global bit line is only four, which is ⅛ of the number described above. That is, the parasitic capacitance in the read global bit lines RGBLs can be reduced to ⅛. Thus, it is possible to reduce the parasitic capacitance in the read global bit lines remarkably.

Furthermore, as shown in FIGS. 3B and 3C, the write global bit lines WGBLs and read global bit-lines RGBLs are made of the metal wiring layer 250 located at the highest level. That is, no metal wiring level exists above the level of the metal wiring layer 250. Therefore, the parasitic capacitances in the write global bit lines WGBLs and read global bit lines RGBLs can be reduced.

Since the parasitic capacitances in the read global bit lines and write global bit lines are reduced, the operating speed of the flash memory is improved.

(2) The read speed can be improved.

In the flash memory, a write operation requires the handling of relatively high voltage, such as −8 V in writing "0" data. To meet the requirement, a high-withstand-voltage MOS transistor with a thick gate insulating film has to be used. On the other hand, the voltage used in a read operation is lower than that in a write operation. Thus, when only a read operation is considered, a low-withstand-voltage MOS transistor with a thin gate insulating film can be used. From the viewpoint of operating speed, it is desirable to use a low-withstand-voltage MOS transistor.

In the configuration according to the first embodiment, the local bit lines are connected to the write global bit lines and read global bit lines. Then, the memory cells are connected to the latch circuits 60 via the write global bit lines and to the sense amplifiers 70 via the read global bit lines. That is, the signal path in a write operation differs from the signal path in a read operation. Thus, for signal path in a read operation, there is no need to take into account measures against high voltages used in a write operation. Thus, a low-withstand-voltage MOS transistor (e.g., MOS transistor 21) can be used for the path in a read operation. Consequently, the read operation speed can be improved.

(3) The reliability of a write operation can be improved.

As explained in item (1), the bit lines are organized in hierarchical form. When the path in a write operation is considered, a plurality of local bit lines are connected to a write global bit line. In a write operation, only one local bit line including the selected memory cell is connected electrically to the write global bit line. The other local bit lines are isolated from the write global bit line. Thus, the voltage corresponding to the write data from the latch circuit is not applied to the local bit lines to which the selected memory cell is not connected. Accordingly, the memory cells connected to these local bit lines are prevented effectively from being written into erroneously, which improves the reliability of the write operation.

For instance, in FIG. 1, in a write operation, suppose the memory cell MC connected to word line WL0 is selected. Then, only the memory cell block BLK including word line WL0 is connected to the write global bit lines WGBL0 to WGBL(2n−1) by the selector SEL. Then, the other memory cell blocks BLKs not including word line WL are isolated from the write global bit lines WGBL0 to WGBL(2n−1) by the selectors SELs. Then, since the voltage corresponding to the write data is not applied to the memory cells MCs in the memory cell blocks BLKs not including word line WL0, the memory cells are less liable to be written into erroneously.

(4) The reliability of a read operation can be improved.

In a conventional flash memory, the source line of a memory cell is made of an impurity diffused layer. With the configuration of the first embodiment, the source line SL is made of the metal wiring layer 200 as explained in FIGS. 3B and 3C. Therefore, the wiring resistance of the source line can be reduced remarkably. This makes it possible to increase the amount of current caused to flow through the memory cell in a read operation, resulting in an improvement in the reliability of the read operation.

Figure 5:
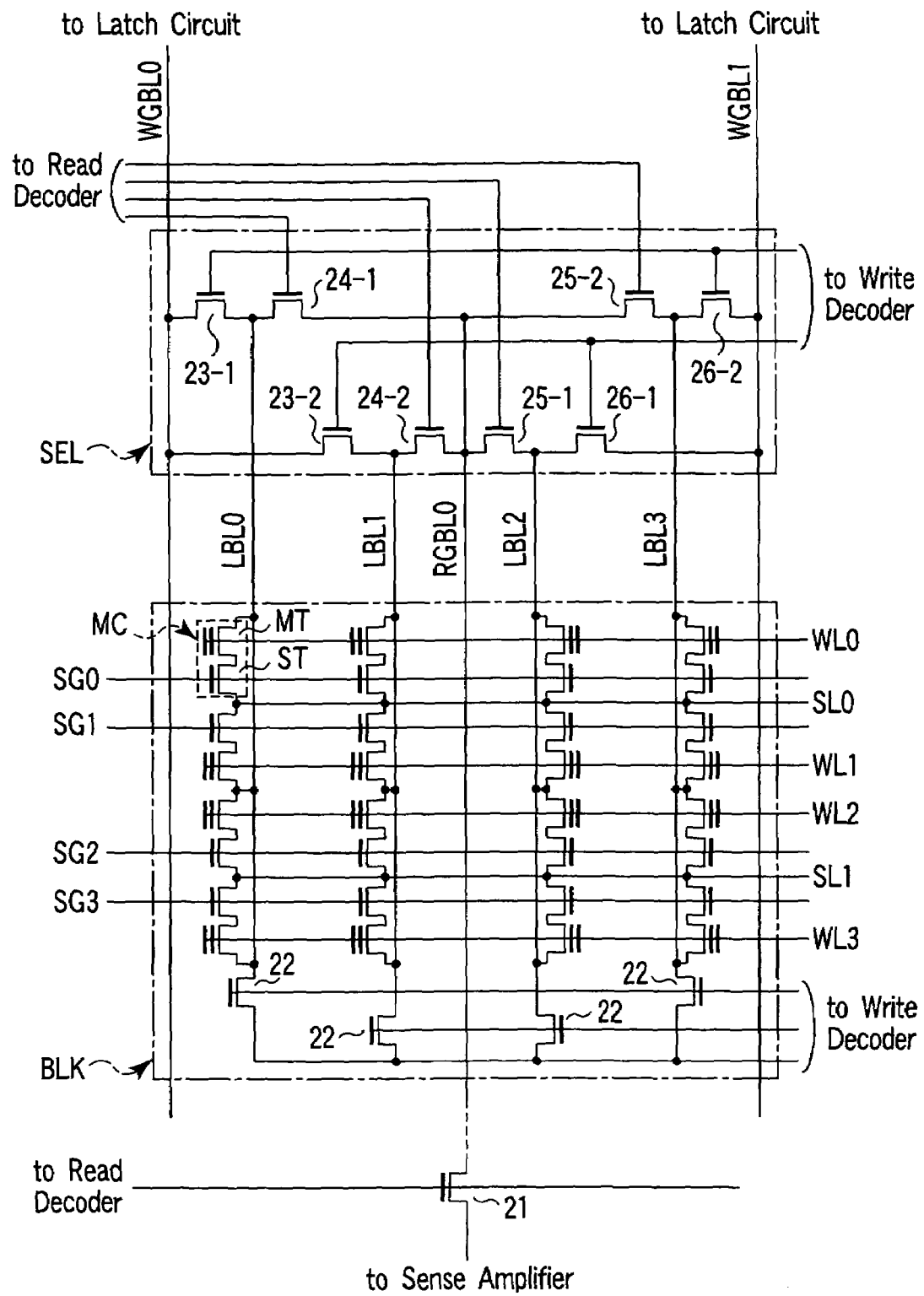
FIG. 5 is a circuit diagram of a memory cell block and a selector included in a flash memory according to a second embodiment of the present invention.

Next, a nonvolatile semiconductor memory device according to a second embodiment of the present invention will be explained by reference to FIG. 5. The second embodiment is such that one memory cell block BLK of the first embodiment includes (4×4) memory cells MCs. FIG. 5 is a circuit diagram of a memory cell block BLK and a selector SEL in a flash memory of the second embodiment. The flash memory of the second embodiment has the same configuration as that of FIG. 1 except that the configuration of the memory cell block BLK and selector SEL in the first embodiment is replaced with the configuration of FIG. 5. Therefore, explanation of the configuration excluding the memory cell block BLK and selector SEL will be omitted.

As shown in FIG. 5, in the second embodiment, one memory cell block includes four columns of memory cells, whereas one memory cell block includes two columns of memory cells MCs in the first embodiment. That is, there are (4×4) memory cells MCs per memory cell block BLK. The drain regions of the memory cell transistors MTs of the memory cells in the four columns are connected to four local bit lines LBL0 to LBL3 in a one-to-one correspondence. One end of each of the local bit lines LBL0 to LBL3 is connected to a selector. SEL. The other ends of the local bit lines are connected to a write decoder 30 via the current paths of MOS transistors 22. The gates of the MOS transistors 22 connected to the local bit lines LBL0, LBL2 are connected in common to one another. The gates of the MOS transistors 22 connected to the local bit lines LBL1, LBl3 are connected in common to one another. Furthermore, the control gates of memory cell transistors MT in the same row are connected in common to any one of the word lines WL0 to WL3. The gates of select transistors ST in the same row are connected in common to any one of the select gate lines SG0 to SG3. The source regions of the select transistors ST are connected in common in all of the memory cells MC.

Next, the configuration of a selector SEL will be explained. A selector SEL, which is provided for each memory cell block BLK, has eight MOS transistors 23-1 to 26-1, 23-2 to 26-2. The four MOS transistors 23-1, 24-1, 25-2, 26-2 are connected in series. The four MOS transistors 23-2, 24-2, 25-1, 26-1 are connected in series. Specifically, one end of the current path of the MOS transistor 23-1 is connected to one end of the current path of the MOS transistor 24-1. The other end of the current path of the MOS transistor 24-1 is connected to one end of the current path of the MOS transistor 25-2. The other end of the current path of the MOS transistor 25-2 is connected to one end of the current path of the MOS transistor 26-2. Furthermore, one end of the current path of the MOS transistor 23-2 is connected to one end of the current path of the MOS transistor 24-2. The other end of the current path of the MOS transistor 24-2 is connected to one end of the current path of the MOS transistor 25-1. The other end of the current path of the MOS transistor 25-1 is connected to one end of the current path of the MOS transistor 26-1. The gates of the MOS transistors 23-1, 23-2, 26-1, 26-2 are connected to the write decoder 30. The gates of the MOS transistors 24-1, 24-2, 25-1, 25-2 are connected to the read decoder 40. The local bit line LBL0 is connected to the connection node of the MOS transistor 23-1 and the MOS transistor 24-1. The local bit line LBL1 is connected to the connection node of the MOS transistor 23-2 and the MOS transistor 24-2. The local bit line LBL2 is connected to the connection node of the MOS transistor 25-1 and the MOS transistor 26-1. The local bit line LBL3 is connected to the connection node of the MOS transistor 25-2 and the MOS transistor 26-2. Furthermore, the other ends of the MOS transistors 23-1, 23-2 are connected to the write global bit line WGBL0. The other ends of the MOS transistors 26-1, 26-2 are connected to the write global bit line WGBL1. The current paths of the MOS transistors 23-1, 23-2 in the same column are connected in common to the write global bit line WGBL0. The current paths of the MOS transistors 26-1, 26-2 in the same column are connected in common to the write global bit line WGBL1. Each of the write global bit lines WGBL0, WGBL1 is connected to the corresponding latch circuit 60. The read global bit line RGBL0 is connected to the connection node of the MOS transistor 24-1 and MOS transistor 25-2 and to the connection node of the MOS transistor 24-2 and MOS transistor 25-1. The connection node of the MOS transistor 24-1 and MOS transistor 25-2 in the same column and the connection node of the MOS transistor 24-2 and MOS transistor 25-1 in the same column are connected in common to the read global bit line RGBL0. Then, one end of the read global bit line RGBL0 is connected to the sense amplifier 70 via the MOS transistor 21. The gate of the MOS transistor 21 is connected to the read decoder 40.

A plurality of memory cell blocks BLK and selectors SEL configured as described above are arranged in a matrix in the memory cell array 20 as explained in the first embodiment.

The configuration of the memory cell array 20 of the second embodiment will also be explained as follows. In the memory cell array 20, a plurality of memory cells MC are arranged in a matrix. The control gates of the memory cell transistors MTs of the memory cells MCs in the same row are connected in common to a word line. The gates of the select transistors of the memory cells in the same row are connected to a select gate line. The drains of the memory cell transistors MTs in four memory cells MCs connected in series in the same-column are connected in common to any one of the local bit lines LBL0 to LBL3. That is, a plurality of memory cells MCs in the memory cell array 20 are connected to one of the local bit lines LBL0 to LBL3 in units of four memory cells MCs arranged in a column. Then, one end of each of the local bit lines LBL0 to LBL3 in the same row is connected in common to one another via the MOS transistor 22 and is connected to the write decoder 30. The other ends of the local bit lines LBL0, LBL1 in the same column are connected in common to any one of the write global bit lines WGBL0 to WGBL(2n-1) in the same column via the MOS transistors 23-1, 23-2, respectively. The other ends of the local bit lines LBL0, LBL1 in the same column are connected in common to any one of the read global bit lines RGBL0 to RGBL(n-1) in the same column via the MOS transistors 24-1, 24-2, respectively. Furthermore, the other ends of the local bit lines LBL2, LBL3 in the same column are connected in common to any one of the write global bit lines WGBL0 to WGBL(2n-1) in the same column via the MOS transistors 26-1, 26-2, respectively. The other ends of the local bit lines LBL2, LBL3 in the same column are connected in common to any one of the read global bit lines RGBL0 to RGBL(n-1) in the same column via the MOS transistors 25-1, 25-2, respectively. Then, the sources of the select transistors STs of the memory cells MCs are connected in common to one another and are connected to the source line driver. In the memory cell array configured as described above, four columns of four memory cells MCs connected to the same local bit line are brought together to form one memory cell block BLK. The memory cell blocks in the same column are connected to a common write global bit line and a common read global bit line. On the other hand, the memory cell blocks in a different column are connected to a different write global bit line and a different read global bit line.

Figure 6A:
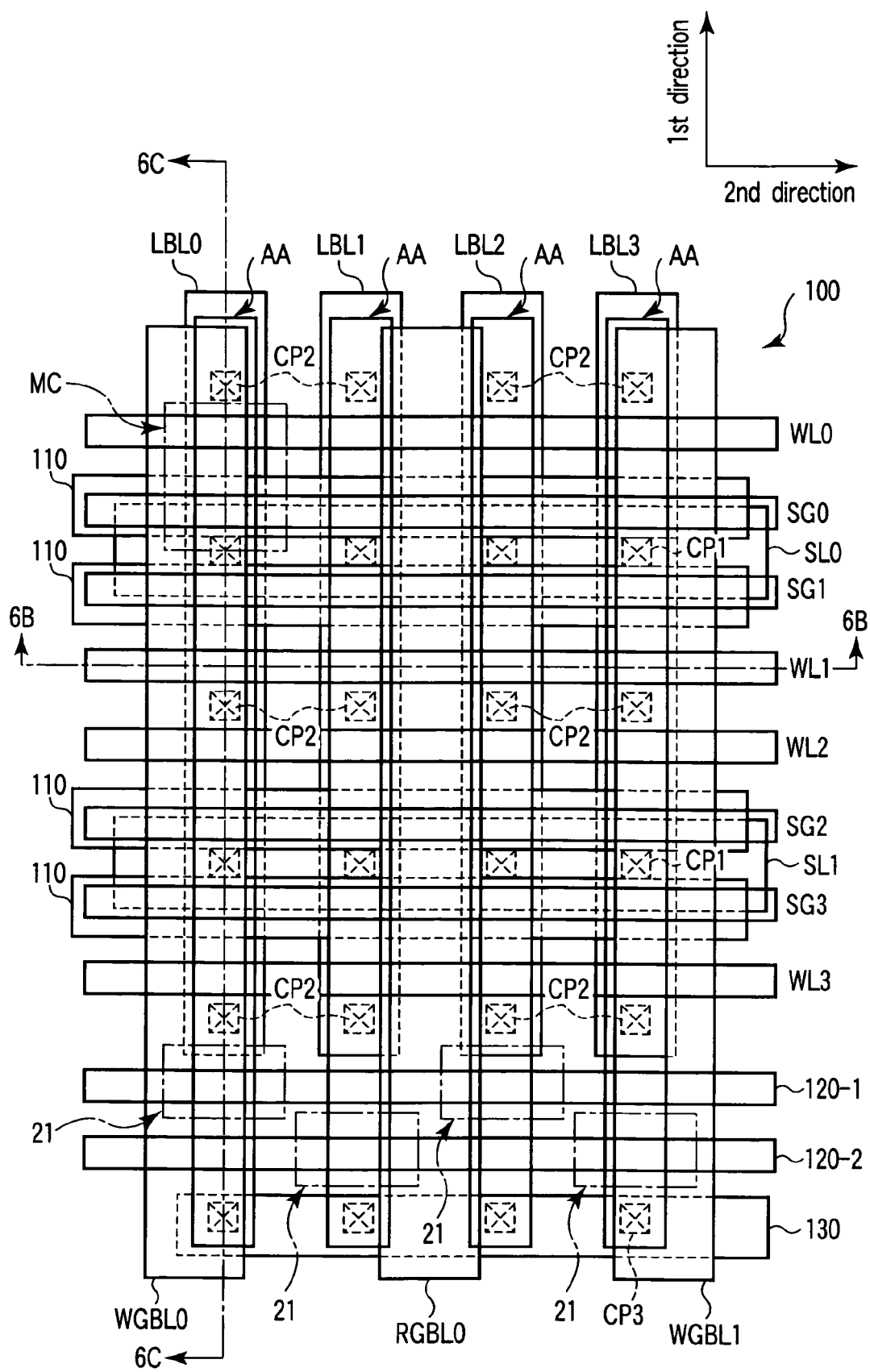
FIG. 6A is a plan view of a memory cell block included in the flash memory of the second embodiment.

Next, a plane pattern of the memory cell block shown in FIG. 5 will be explained. FIG. 6A is a plan view of the memory cell block BLK of FIG. 5.

As shown in the figure, the plane pattern of a memory cell block BLK included in a flash memory of the second embodiment is such that two units of the plane pattern of FIG. 3A explained in the first embodiment are arranged side by side without changing the number of read global bit lines and write global bit lines. Therefore, it will be explained briefly. Four stripe-shaped element regions AAs extending the first direction are arranged in the second direction. Then, stripe-shaped word lines WL0 to WL3 and select gate lines SG0 to SG3 extending in the second direction are formed in such a manner that they cross four element regions AAs. Of course, these word lines WL0 to WL3 and select gate lines SG0 to SG3 are connected in common in a plurality of memory cell blocks (not shown) adjacent to one another in the second direction.

Then, stripe-shaped source lines SL0, SL1 extending in the second direction are formed on the two select gate lines SG0, SG1 adjacent to each other and the two select gate lines SG2, SG3 adjacent to each other. Four stripe-shaped local bit lines LBL0 to LBL3 extending in the first direction are formed in such a manner that they almost overlap with the element region AA. One end of each of the local bit lines LBL0 to LBL3 is connected to the selector SEL corresponding to the memory cell block BLK. The local bit line LBL0 to LBL3 are connected to the drain region of each memory cell transistor MT via a contact plug CP2. A stripe-shaped metal wiring layer 110 extending in the second direction is formed in the region just above each of the select gate lines SG0 to SG3. The metal wiring layer 110 functions as shunt wiring for the select gate lines SG0 to SG3. In the position farthest from the corresponding selector SEL, the two gate electrodes 120-1, 120-2 of the MOS transistors 21 are formed so that they are shaped like stripes extending in the second direction. In each element region AA, only one of the two gate electrodes 120-1, 120-2 practically functions as a gate electrode and the other functions just as a passing wire on the element region AA. In the element region AA connected to the local bit lines LBL0, LBL2, the gate electrode 120-1 practically functions as a gate electrode. In the element region AA connected to the local bit lines LBL1, LBL3, the gate electrode 120-2 practically functions as a gate electrode. Then, the source regions of the four MOS transistors 21 are connected to a metal wiring layer 130 via contact plugs CP3. Furthermore, in a layer higher than the wiring, three stripe-shaped metal wiring layers extending in the first direction are formed. These three metal wiring layers are two write global bit lines WGGL0, WGBL1 and read global bit line RGBL0 sandwiched with the write global bit lines.

Figure 6B:
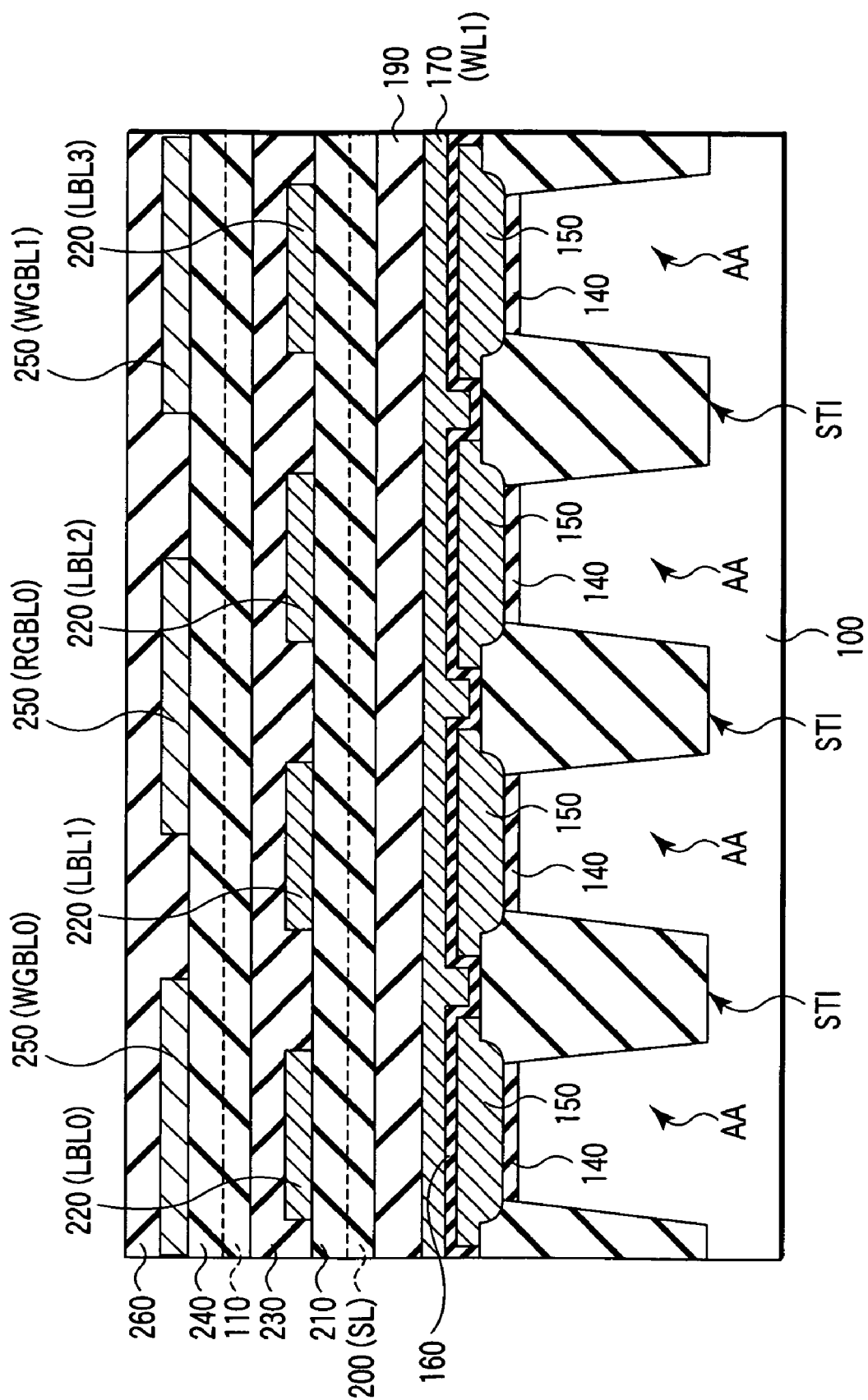
FIG. 6B is a sectional view taken along line 6B-6B of FIG. 6A.

Next, a sectional structure of the memory cell block BLK will be explained. Since a sectional structure taken long line 6C-6C of FIG. 6A is the same as that of FIG. 3C except that there are two gate electrodes 120, explanation of the structure will be omitted. FIG. 6B is a sectional view taken along line 6B-6B of FIG. 6A.

As shown in the figure, the sectional structure of a memory cell block in a flash memory of the second embodiment is such that two patterns of the structure of FIG. 3B are arranged side by side in the traverse direction. Specifically, in a semiconductor substrate 100, element isolating regions STIs are formed, which forms four element regions AAs enclosed by the element isolating regions STIs. A polycrystalline silicon layer 150 is formed on each of the four element regions AAs with a gate insulating film 140. A polycrystalline silicon layer 170 is formed on the polycrystalline silicon layer 150 with an inter-gate insulating film 160 interposed therebetween. As described above, the polycrystalline silicon layers 150, 170 not only function as a floating gate and a control gate in a memory cell transistor MT, respectively, but also function as a gate electrode in a select transistor.

Then, an interlayer insulating film 190 is formed on the semiconductor substrate 100 so as to cover the stacked layer gates of the memory cell transistors and the gate electrodes of the select transistors. A metal wiring layer 200 serving as a source line SL and an interlayer insulating film 210 are formed on the interlayer insulating film 190. Four metal wiring layers 220 serving as local bit lines LBL0 to LBL3 are formed on the interlayer insulating film 210. Then, an interlayer insulating film 230 is formed on the interlayer insulating film 210 so as to cover the four metal wiring layers 220. A metal wiring layer 110 functioning as shunt wiring for select gate lines SGs is formed on the interlayer insulating film 230. An interlayer insulating film 240 is formed on the interlayer insulating film 230 so as to cover the metal wiring layer 110. Three metal wiring layers 250 are formed on the interlayer insulating film 240. These metal wiring layers 250 function as write global bit lines WGBL0, WGBL1, and read global bit line RGBL0. Then, an interlayer insulating film 260 is formed so as to cover the metal wiring layer 250 on the interlayer insulating film 240.

Next, the operation of the flash memory configured as described above will be explained.

<Write Operation>

The data is written simultaneously into all of the memory cell blocks in the same row. In each memory cell block, the memory cells written into at the same time are the following two memory cells: a memory cell connected to one of the local bit lines LBL0, LBL1 and a memory cell connected to one of the local bit lines LBL2, LBL3. As in the first embodiment, electrons are injected into the floating gate by FN tunneling.

First, as in the first embodiment, a voltage corresponding to the write data is applied to each of the write global bit lines WGBLs. The write decoder 30 selects any one of the word lines and turns off the MOS transistors 22. The select gate decoder 50 brings all the select gate lines into the unselected state.

Then, the write decoder 30 turns on not only one of the MOS transistors 23-1, 23-2 but also any one of the MOS transistors 26-1, 26-2 in the selector SEL corresponding to the memory cell block BLK including the selected word line. As a result, the write global bit lines WGBLs are connected electrically to one of the local bit lines LBL0, LBL1 and one of the local bit lines LBL2, LBL3. The write decoder 30 turns off the MOS transistors 23-1, 23-2, 26-1, 26-2 in the selectors corresponding to the memory cell blocks not including the selected word line. On the other hand, the read decoder 40 turns off all the MOS transistors 24-1, 24-2, 25-1, 25-2 in all of the selectors SELs. Thus, the read global bit line RGBL is isolated electrically from the local bit lines LBL0 to LBL3.

As a result, a voltage corresponding to "1" data or "0" data ia respectively applied to one of the local bit lines LBL0 and LBL1 in the memory cell block BLK including the selected word line via the MOS transistor 23-1 or 23-2 in the selector SEL from the write global bit line. Furthermore, a voltage corresponding to "1" data or "0" data is respectively applies to one of the local bit line LBL2 and LBL3 in the memory cell block BLK including the selected word line via the MOS transistor 26-1 or 26-2 in the selector SEL from the write global bit line.

As a result, as explained in the first embodiment, the data is written into the memory cell connected to the selected word line and the local bit line LBL0 or LB11 and the local bit line LBL2 or LBL3.

<Read Operation>

As in the first embodiment, the data is read simultaneously from a plurality of memory cells connected to a given word line in such a manner that the data is read from one memory cell MC in each block.

First, as in the first embodiment, the select gate 50 selects any one of the select gate lines SGs (brings any one of the select gate lines SGs into the high level). The write decoder 30 brings all the word lines WLs to the unselected state (or into the low level) and turns off the MOS transistors 22. Furthermore, the source line driver 80 sets the potential of the source line at 0 V.

Then, the read decoder 40 turns on any one of the four MOS transistors 24-1, 24-2, 25-1, 25-2 in the selector SEL corresponding to the memory cell block BLK including the selected select gate line. As a result, the read global bit line RGBL is connected electrically to any one of the local bit lines LBL0 to LBL3. The read decoder 40 turns off all the four MOS transistors 24-1, 240-2, 25-1, 25-2 in the selector SEL corresponding to the memory cell block BLK not including the selected select gate line. On the other hand, the write decoder 30 turns off all the four MOS transistors 23-1, 23-2, 26-1, 26-2 in all the selectors SELs. Thus, the write global bit line WGBL is isolated electrically form the local bit lines LBL0 to LBL3. In addition, the read decoder 40 turns on the MOS transistors 21.

As a result, in each memory cell block, the memory cell connected to any one of the local bit lines LBL0 to LBL3 is connected to the sense amplifier 70 via any one of the MOS transistors 24-1, 24-2, 25-1, 25-2 and the read global bit line.

Thereafter, as in the first embodiment, a change in the potential of the read global bit line RGBL is amplified by the sense amplifier 70, thereby reading the data.

<Erase Operation>

Since an erase operation is identical with that in the first embodiment, its explanation will be omitted.

As described above, the flash memory of the second embodiment produces the effects described in items (1) to (4) as in the first embodiment.

Specifically, with the configuration of the second embodiment, in a memory cell block, a plurality of memory cells are connected to one local bit line. One memory cell block includes four local bit lines. In each memory cell block, two local bit lines are connected to one write global bit line. In each memory cell block, four local bit lines are connected to one read global bit line.

Then, in a write operation, only one memory cell block is connected electrically to one write global bit line. Only one of the two local bit lines in the memory cell block is connected electrically to the write global bit line. In a read operation, only one memory cell block is connected electrically to one read global bit line. Then, only one of the four local bit lines in the memory cell block is connected electrically to the read global bit line.

As described above, in the second embodiment, too, the bit lines are organized in hierarchical form as in the first embodiment. Furthermore, as shown in FIG. 6B, the write global bit line and read global bit line are made of the metal wiring layer 250 located at the highest level.

Consequently, the effect of improving the operating speed of the flash memory in item (1) is attained.

In addition, organizing the bit lines in hierarchical form as described above accomplishes the effect of improving the reliability of a write operation in item (3).

The effects in item (2) and item (4) are as explained in the first embodiment.

The second embodiment further produces the following effect:

(5) A flash memory manufacturing method can be made easier.

In the first embodiment, the number of metal wiring layers 250 per memory cell block BLK is three as explained in FIGS. 3A and 3B. One memory cell block BLK includes two columns of memory cells. Thus, three metal wiring layers 250 are formed in the area where two columns of memory cells are formed.

However, in the second embodiment, four columns of memory cells are included in one memory cell block BLK. Thus, as shown in FIGS. 6A and 6B, three metal wiring layers 250 are formed in the area where four columns of memory cells are formed. That is, the metal wiring layers 250 are placed in the area twice that in the first embodiment. In other words, the wiring allowance for the metal wiring layers 250 doubles. Thus, the patterning of the metal wiring layers 250 becomes easier, which simplifies the manufacture of flash memories.

Furthermore, since the wiring allowance doubles, the adjacent metal wiring layers 250 are isolated from one another reliably, which contributes to an improvement in the fabrication yield.

Figure 7:
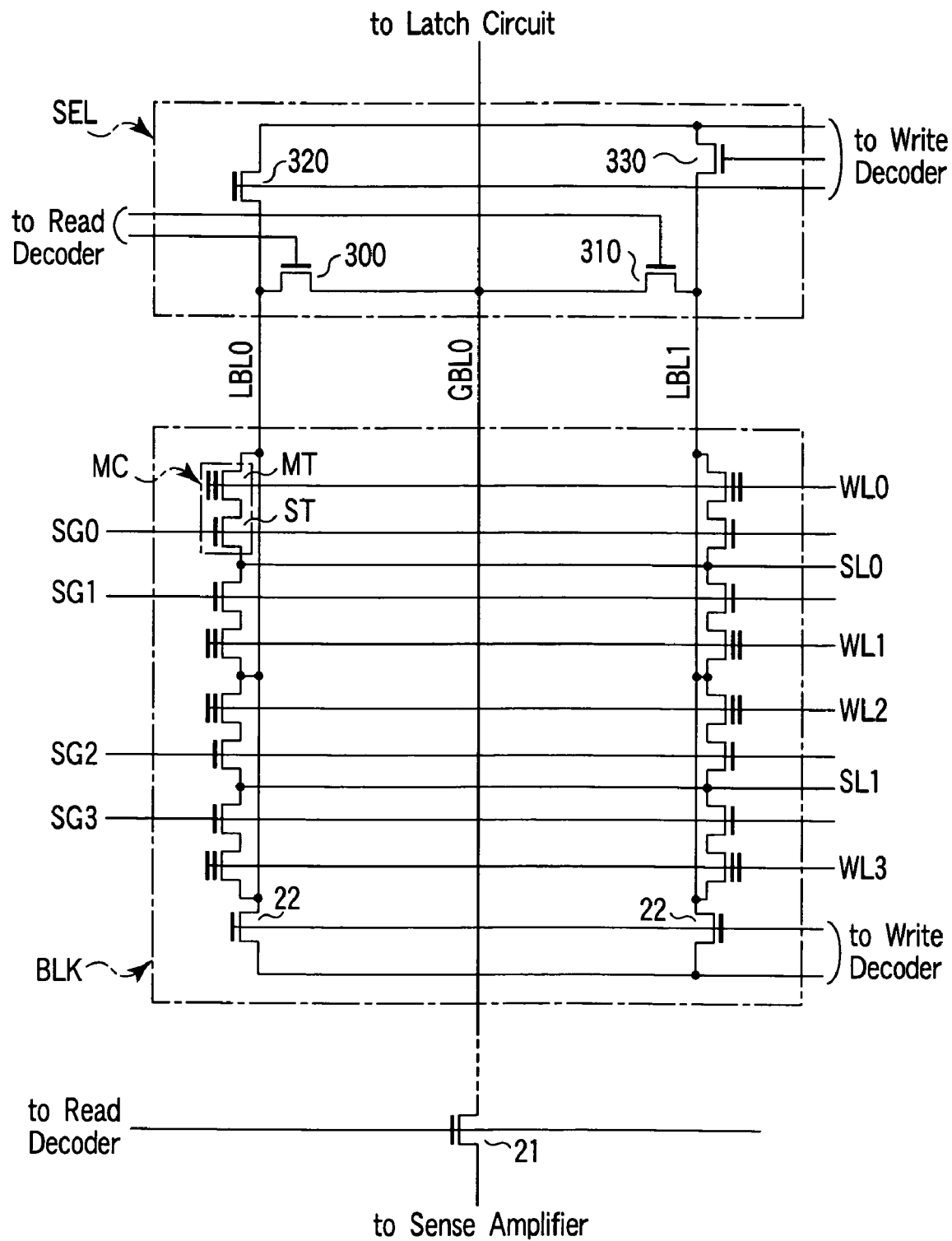
FIG. 7 is a circuit diagram of a memory cell block and a selector included in a flash memory according to a third embodiment of the present invention.

Next, a nonvolatile semiconductor memory device according to a third embodiment of the present invention will be explained by reference to FIG. 7. The third embodiment is such that the write global bit line and read global bit line in the first embodiment are in common use. FIG. 7 is a circuit diagram of a memory cell block BLK and a selector SEL included in a flash memory according to the third embodiment. A flash memory of the third embodiment is the same as that of FIG. 1 except that the configuration of the memory cell block BLK and selector SEL is replaced with that of FIG. 7.

As shown in the figure, the configuration of a memory cell block BLK is the same as that of the first embodiment. That is, each memory cell block BLK includes two columns of memory cells.

A selector SEL includes four MOS transistors 300 to 330. As shown in the figure, the MOS transistors 300, 310 are connected in series between local bit lines LBL0 and LBL1. Specifically, one end of the current path of the MOS transistor 300 is connected to the local bit line LBL0. The other end of the current path of the MOS transistor 300 is connected to one end of the current path of the MOS transistor 310. The other end of the current path of the MOS transistor 310 is connected to the local bit line LBL1. The gates of the MOS transistors 300, 310 are connected to the read decoder 40. The connection node of the MOS transistors 300, 310 is connected to any one of the global bit lines GBL0 to GBL(n-1). The connection node of the MOS transistors 300, 310 in each of the selectors SEL in the same column is connected in common to each of the global bit lines GBL0 to GBL(n-1). One end of each of the global bit lines GBL0 to GBL(n-1) is connected to a latch circuit 60. The other end of each of the global bit lines GBL0 to GBL(n-1) is connected to a sense amplifier 70 via a MOS transistor 21. The gates of the MOS transistors 21 provided for the respective global bit lines GBL0 to GBL(n-1) are connected in common to one another and are connected to the read decoder 40.

Furthermore, one end of the current path of the MOS transistor 320 is connected to the local bit line LBL0. One end of the current path of the MOS transistor 330 is connected to the local bit line LBL1. The other ends of the current paths of the MOS transistors 320, 330 are connected in common to one another and are connected to the read decoder 30. The gates of the MOS transistors 320, 330, which are independent of each other, are connected to the write decoder 30.

Specifically, a plurality of memory cells MC in the memory cell array 20 are connected to a different local bit line in units of four memory cells MCs arranged in a column. Then, one end of each of the local bit lines in the same row is connected in common via a MOS transistor 22 and is connected to the write decoder 30. The other ends of the local bit lines LBL0, LBL1 in the same column are connected to any of the global bit lines GBL0 to GBL(n-1) via the MOS transistors 300, 310, respectively, and are connected to the write decoder 30 via the MOS transistors 320, 330, respectively. Then, two columns of four memory cells MCs connected to the same local bit line are put together, thereby forming one memory cell block BLK. The memory cell blocks in the same column are connected to a common global bit line GBL. The memory cell blocks in a different column are connected to a different global bit line GBL.

The write decoder 30 selects any one of the word lines WL0 to WL(4m-1) in a write operation. Furthermore, the write decoder 30 not only selects one of the MOS transistors 320, 330 in the selector SEL but also sets the potential of the other end of the current path of each of the MOS transistors 320, 330 at 0 V. In addition, the write decoder 30 supplies a voltage to the gate of the MOS transistor 22 and to the common connection node of a plurality of local bit lines.

The read decoder 40 selects one of the MOS transistors 300, 310 in the selector SEL and supplies a voltage to the gate of the selected MOS transistor in a write and a read operation. Furthermore, the read decoder 40 applies a potential to the gate of the MOS transistor 21.

Since the remaining configuration is the same as that of the first embodiment, its explanation will be omitted. A plane pattern and a sectional structure of the memory cell block BLK are such that the two write global bit lines WGBL are eliminated and the read global bit line RGBL is replaced with a global bit line GBL in FIGS. 3A to 3C. Therefore, explanation of them will be omitted.

Next, the operation of the flash memory will be explained.

<Write Operation>

The data is written simultaneously into the memory cell blocks in the same row as in the first embodiment. In each memory cell block, the memory cells written into at the same time are only those connected to one of the local bit lines LBL0, LBL1. The injection of electrons into the floating gate is carried out by FN tunneling.

First, as in the first embodiment, a voltage corresponding to the write data is applied to each of the global bit lines GBLs. The write decoder 30 selects any one of the word lines and turns off the MOS transistors 22. The select gate decoder 50 brings all the select gate lines into the unselected state. In addition, the read decoder 40 turns off the MOS transistor 21.

Then, the read decoder 40 turns on one of the MOS transistors 300, 310 in the selector SEL corresponding to the memory cell block BLK including the selected word line. As a result, the global bit line GBL is connected electrically to one of the local bit lines LBL0, LBL1. The write decoder 30 turns off the MOS transistors 300, 310 in the selectors SEL corresponding to the memory cell blocks BLK not including the selected word line.

Furthermore, the write decoder 30 turns on one of the MOS transistors 320, 330 in the selector SEL corresponding to the memory cell block BLK including the selected word line. When the MOS transistor 300 is turned on, the MOS transistor 330 is turned on and the MOS transistor 320 is turned off. On the other hand, when the MOS transistor 310 is turned on, the MOS transistor 320 is turned on and the MOS transistor 330 is turned off. Then, the write decoder 30 applies 0 V to the connection node of the MOS transistors 320, 330. That is, the local bit line unconnected to the global bit line GBL is connected to the write decoder by the MOS transistor 320 or 330. Then, 0 V is applied to the local bit line.

As a result, the global bit line GBL applies a voltage corresponding to "1" data or "0" data to the local bit line LBL0 or LBL1 in the memory cell block BLK including the selected word line via the MOS transistor 300 or 310 in the selector SEL. Consequently, as explained in the first embodiment, the data is written into the memory cell which is connected to the selected word line and the local bit line LBL0 or LB1.

Figure 8A:
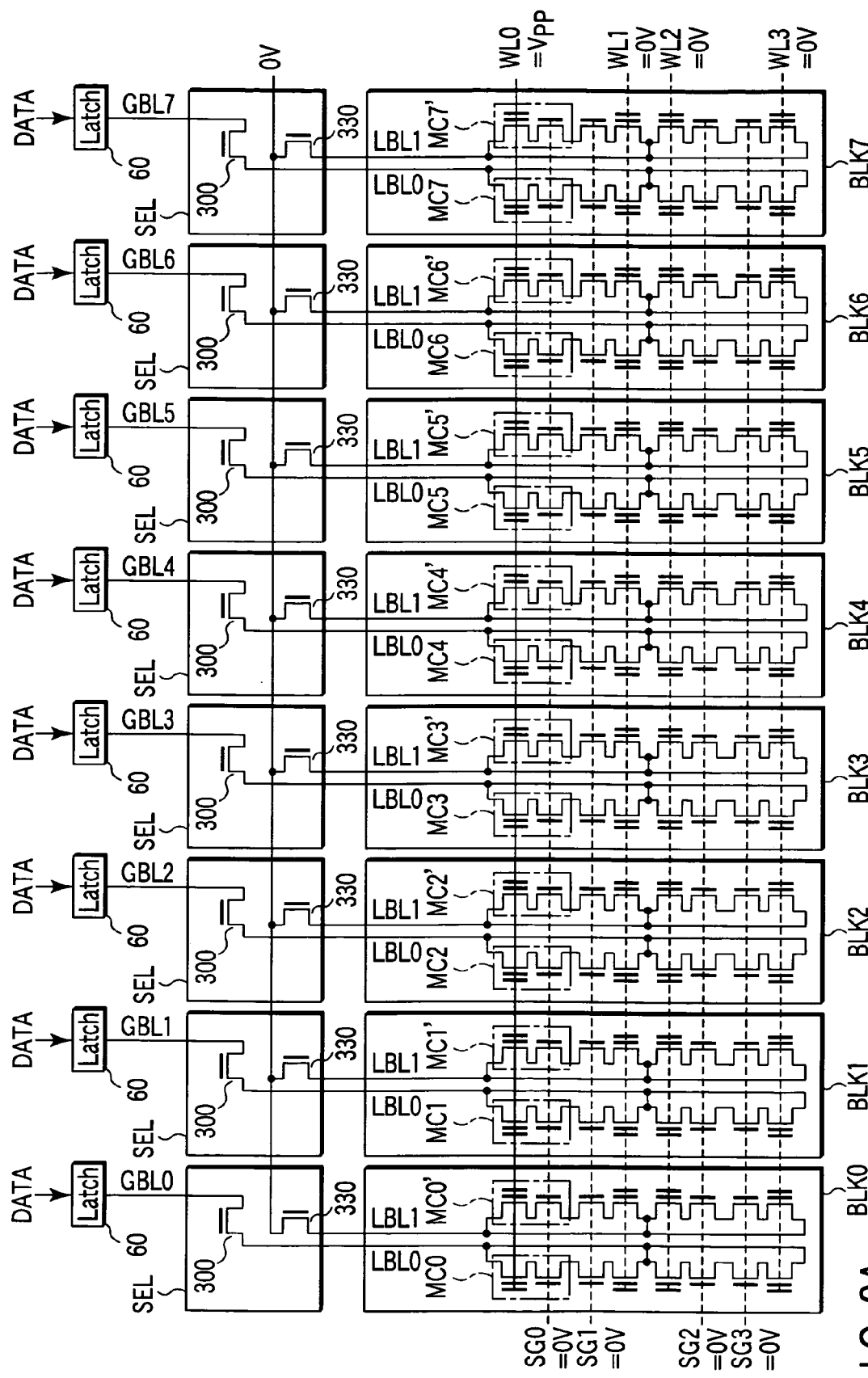
FIG. 8A is a circuit diagram of a part of the flash memory of the third embodiment, which helps explain a write operation.

FIG. 8A is a circuit diagram to help explain how the data is written into memory cells MC connected to word line WL0. It is assumed that there are eight memory cell blocks BLKs in the direction of word line. The eight memory cell blocks BLKs including word line WL0 are referred to as BLK0 to BLK7. The memory cells MC connected to word line WL0 and to local bit line LBL0 are referred to as MC0 to MC7. The memory cells MC connected to word line WL0 and to local bit line LBL1 are referred to as MC0' to MC7'. A case where the data is written into the memory cells MC0 to MC7 connected to local bit line LBL0 will be explained.

As shown in the figure, in the individual latch circuits 60, the data to be written into the corresponding memory cells MC0 to MC7 is stored. When the MOS transistor 300 in the selector SEL is turned on, causing each of the global bit lines GGL0 to GBL7 to be connected to local bit line LBL0, the potential (0 V or VBB) corresponding to the write data is applied to the drain regions of the memory cells MC0 to MC7. Since the memory cell blocks excluding the memory cell blocks BLK0 to BLK7 are isolated from the global bit lines GBL0 to GBL7, they are invisible to the global bit lines GBL0 to GBL7. In the memory cell blocks BLK0 to BLK7, too, since the MOS transistors 310 are in the off state, the memory cells connected to local bit line LBL1 are invisible to the global bit lines GBL0 to GBL7.

Then, Vpp is applied to word line WL0 and the other word lines WL1 to WL3 are connected to GND. As a result, the data held in the latch circuits 60 is written simultaneously into all of the memory cells MC0 to MC7 connected to word line WL0 and local bit line LBL0.

At this time, the write decoder 30 applies 0 V to local bit line LBL1 in each of the memory cell blocks BLK0 to BLK7 via the MOS transistor 330. Thus, no electrons are injected into the memory cells MC0' to MC7' connected to local bit line LBL1. That is, no data is written into the memory cells MC0' to MC7'. Of course, since the word lines WL1 to WL3 are unselected, no data is written into the memory cells connected to local bit line LBL1 excluding the memory cells MC0' to MC7'.

<Read Operation>

As in the first embodiment, the data is read simultaneously from a plurality of memory cells connected to any one of the word lines in such a manner that the data is read from one memory cell in each block.

First, as in the first embodiment, the select gate decoder 50 selects any one of the select gate lines SGs. The write decoder 30 brings all the word lines WLs into the unselected state and turns off the MOS transistors 22. Furthermore, the source line driver 80 sets the potential of the source line at 0 V.

Then, the read decoder 40 turns on the MOS transistors 300 or 310 in the selector SEL corresponding to the memory cell block BLK including the selected select gate line. To read the data from the memory cell connected to local bit line LBL0, the MOS transistor 300 is turned on and the MOS transistor 310 is turned off. On the other hand, to read the data from the memory cell connected to local bit line LBL1, the MOS transistor 310 is turned on and the MOS transistor 300 is turned off. As a result, the global bit line GBL is connected electrically to the local bit line LB10 or LBL1. The MOS transistors 300, 310 in the selector SEL corresponding to the memory cell block BLK not including the selected gate line are turned off. Furthermore, the read decoder 40 turns on the MOS transistor 21.

The write decoder 30 turns off the MOS transistors 320, 330 in the selector SEL.

As a result, in each memory cell block, the memory cell connected to the local bit line LBL0 or LBL1 is connected to the sense amplifier 70 via the MOS transistor 300 or 310 and the global bit line GBL. Thereafter, as in the first embodiment, a change in the potential of the global bit line GBL is amplified by the sense amplifier 70, thereby reading the data.

Figure 8B:
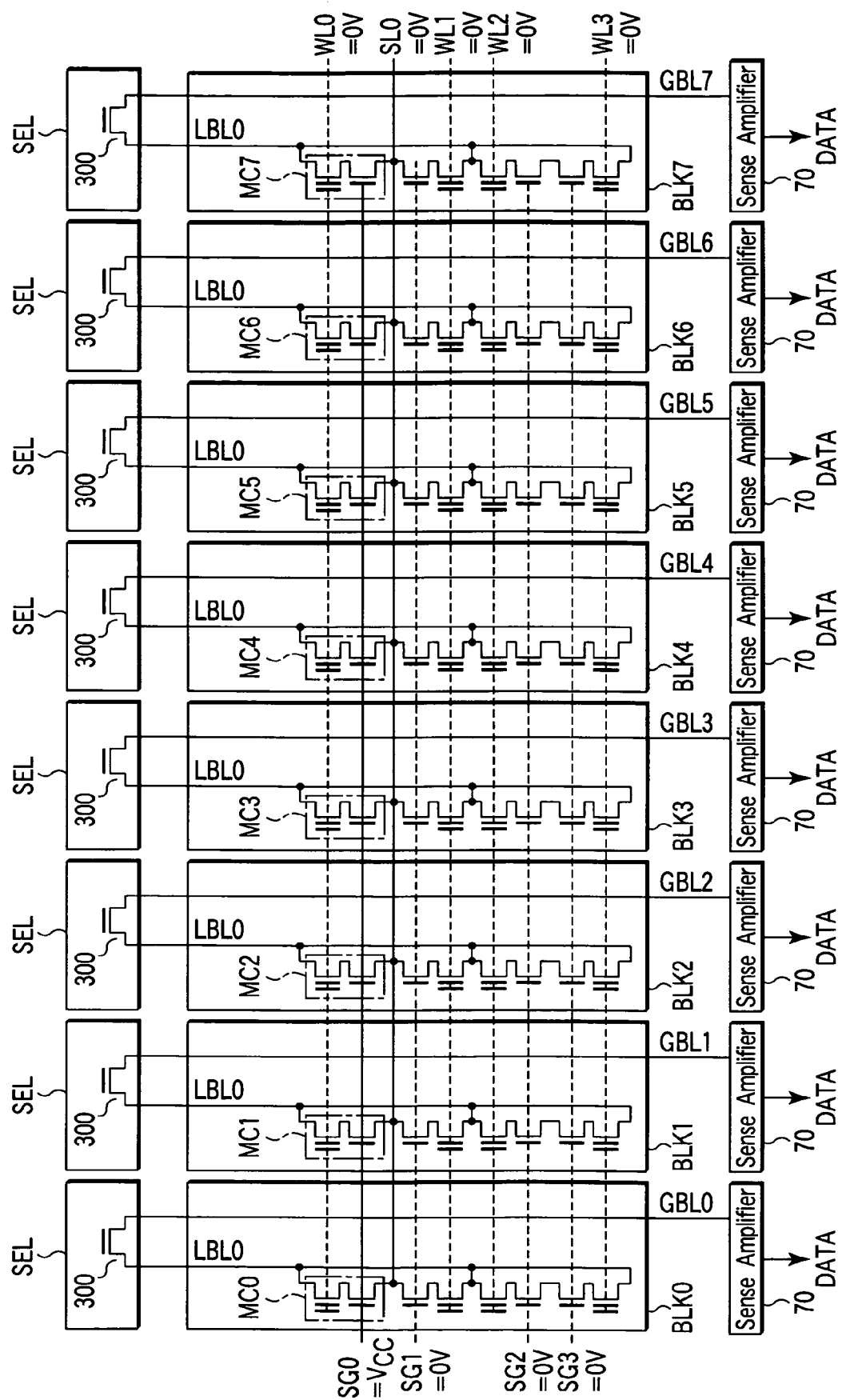
FIG. 8B is a circuit diagram of a part of the flash memory of the third embodiment, which helps explain a read operation.

FIG. 8B is a circuit diagram to help explain how the data is read from the memory cells MC connected to word line WL0 and local bit line LBL0. It is assumed that there are eight memory cell blocks BLKs in the direction of the word line. The eight memory cell blocks BLKs including word line WL0 are referred to as BLK0 to BLK7. The memory cells MC connected to word line WL0 and to local bit line LBL0 are referred to as MC0 to MC7. A case where the data is read from the memory cells MC0 to MC7 connected to local bit line LBL0 will be explained.

As shown in the figure, when the MOS transistor 300 in the selector SEL is turned on, each of the global bit lines GBL0 to GBL7 is connected to local bit line LBL0. Then, a potential of about 1 V is applied to the global bit lines GBL0 to GBL7. Since the memory cell blocks excluding the memory cell blocks BLK0 to BLI7 are isolated electrically from the global bit lines GBL0 to GBL7, they are invisible to the global bit lines GBL0 to GBL7. Furthermore, since the MOS transistor 310 is turned off, local bit line LBL1 is isolated electrically from the global bit lines GBL0 to GBL7 in the memory cell blocks BLK0 to BLK7. Thus, the memory cells MC connected to local bit line LBL1 are invisible to the global bit lines GBL0 to GBL7.

Then, a high level is applied to select gate line SG0 and the other select gate lines SG1 to SG3 are brought to the low level. As a result, the data is read simultaneously from all the memory cells MC0 to MC7 connected to word line WL0 to local bit line LBL0.

In the above example, the case where the data is read from the memory cells connected to local bit line LBL0 has been explained. To read the data from the memory cells connected to local bit line LBL1, the MOS transistor 310 in the selector SEL is turned on and the MOS transistor 300 is turned off.

<Erase Operation>

Since an erase operation is the same as that in the first embodiment, its explanation will be omitted.

As described above, the flash memory of the third embodiment produces the effects described in items (1), (3), and (4) in the first embodiment and the effect described in item (5) in the second embodiment.

Specifically, with the configuration of the third embodiment, in a memory cell block, a plurality of memory cells are connected to one local bit line and one memory cell block includes two local bit lines. Then, the two local bit lines included in one memory cell block are connected to one global bit line.

Then, in a write operation and in a read operation, only one memory cell block is connected electrically to one global bit line. Then, only one of the two local bit lines in the memory cell block is connected electrically to the global bit line.

As described above, in the third embodiment, too, the bit lines are organized in hierarchical form as in the first embodiment. Furthermore, the global bit lines are made of the metal wiring layer located at the highest level. As a result, the effect of improving the operating speed of the flash memory in item (1) is attained.

In addition, organizing the bit lines in hierarchical form produces the effect of improving the reliability of a write operation in item (3).

The effect in item (4) is as explained in the first embodiment.

Furthermore, in the configuration of FIG. 7, only one global bit line GBL passes through one memory cell block. That is, one metal wiring layer 250 is formed in the region where two columns of memory cells are formed. Thus, it is possible to secure a wiring allowance in forming the metal wiring layer 250. As a result, the effect of simplifying a flash memory manufacturing method is achieved.

Figure 9:
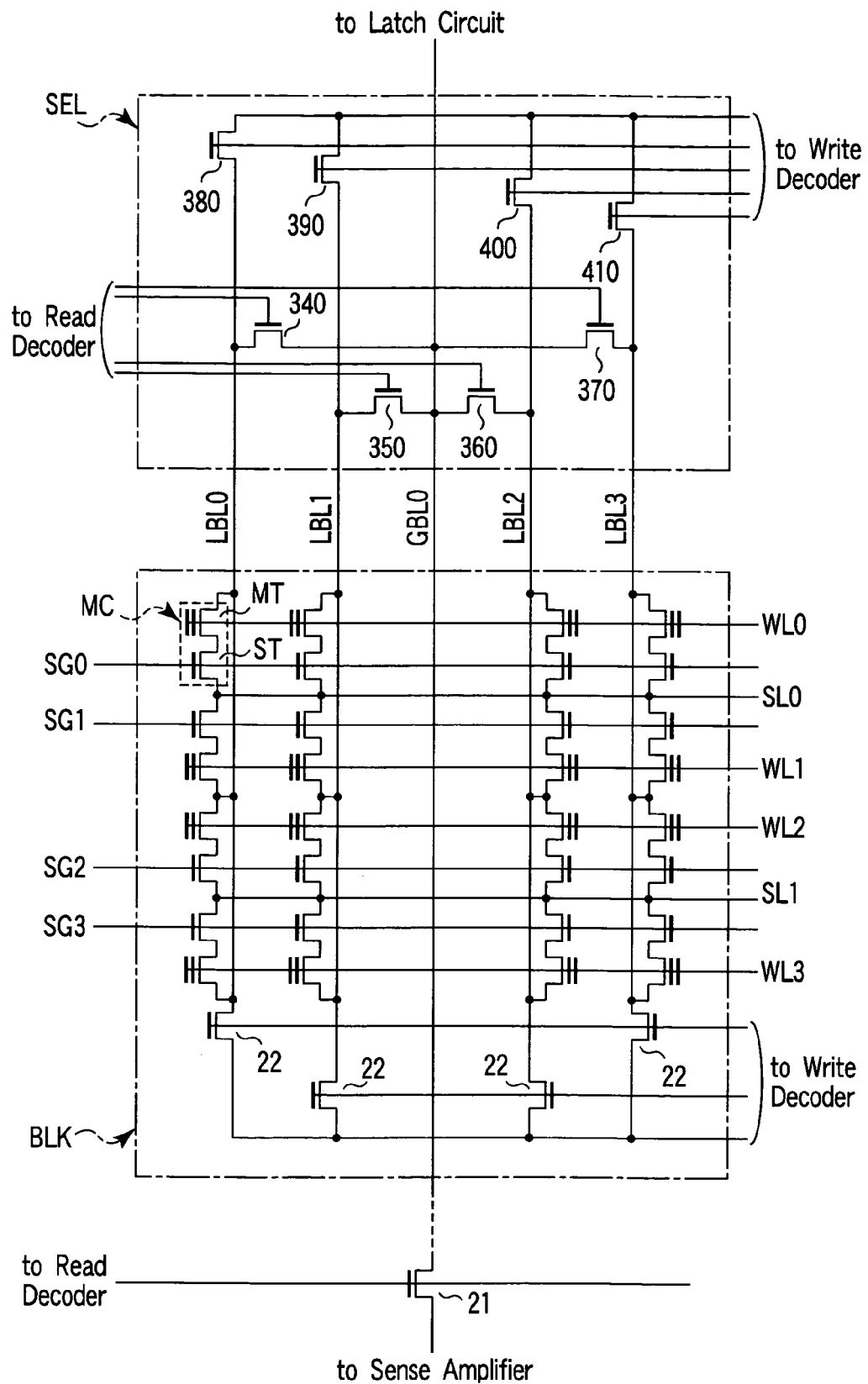
FIG. 9 is a circuit diagram of a memory cell block and a selector included in a flash memory according to a fourth embodiment of the present invention.

Next, a nonvolatile semiconductor memory device according to a fourth embodiment of the present invention will be explained by reference to FIG. 9. The fourth embodiment is a combination of the second and third embodiments. FIG. 9 is a circuit diagram of a memory cell block BLK and a selector SEL included in a flash memory according to the fourth embodiment. A flash memory of the fourth embodiment is the same as that of FIG. 1 except that the configuration of the memory cell block BLK and selector SEL is replaced with that of FIG. 9.

As shown in the figure, the configuration of a memory cell block BLK is the same as that of the second embodiment. Each memory cell block BLK includes four columns of memory cells.

A selector SEL includes eight MOS transistors 340 to 410. As shown in the figure, the MOS transistors 340, 370 are connected in series between the local bit lines LBL0 and LBL3. Specifically, one end of the current path of the MOS transistor 340 is connected to local bit line LBL0. The other end of the current path of the MOS transistor 340 is connected to the current path of the MOS transistor 370. The other end of the current path of the MOS transistor 370 is connected to the local bit line LBL3. The gates of the MOS transistors 340, 370 are connected to the read decoder 40. The connection node of the MOS transistors 340, 370 is connected to any one of the global bit lines GBL0 to GBL(n–1). The MOS transistors 350, 360 are connected in series between the local bit lines LBL1 and LBL2. Specifically, one end of the current path of the MOS transistor 350 is connected to local bit line LBL1. The other end of the current path of the MOS transistor 350 is connected to one end of the current path of the MOS transistor 360. The other end of the current path of the MOS transistor 360 is connected to the local bit line LBL2. The gates of the MOS transistors 350, 360 are connected to the read decoder 40. The connection node of the MOS transistors 350, 360 is connected to any one of the global bit lines GBL0 to GBL(n–1). The connection node of the MOS transistors 340, 370 and the connection node of the MOS transistors 350, 360 in the same column are connected in common to each of the global bit lines GBL0 to GBL(n–1). Then, one end of each of the global bit lines GBL0 to GBL(n–1) is connected to a latch circuit 60. The other end of each of the global bit lines GBL0 to GBL(n–1) is connected to a sense amplifier 70 via a MOS transistor 21.

Furthermore, one end of the current path of each of the MOS transistors 380 to 410 is connected to the local bit lines LBL0 to LBL3, respectively. The other ends of the current paths of the MOS transistors 380 to 410 are connected in common to one another and are connected to the write decoder 30. The gates of the MOS transistors 380 to 410 are connected to the write decoder 30.

Specifically, a plurality of memory cells MC in the memory cell array 20 are connected to a different local bit line in units of four memory cells MCs arranged in a column. Then, one end of each of the local bit lines LBL0 to LBL3 in the same row is connected in common via a MOS transistor 22 and is connected to the write decoder 30. The other ends of the local bit lines LBL0 to LBL3 in the same column are connected in common to any one of the global bit lines GBL0 to GBL(n–1) via the MOS transistors 340 to 370, respectively, and further connected to the write decoder 30 via the respective MOS transistors 380 to 410.

The write decoder 30 selects any one of the word lines WL0 to WL(4m–1) in a write operation. Furthermore, the write decoder 30 selects one of the MOS transistors 380 to 410 in the selector SEL and sets the potential of the other end of the current path of each of the MOS transistors 380 to 410 at 0 V. In addition, the write decoder 30 supplies a voltage to the gate of the MOS transistor 22 and to the common connection node of a plurality of local bit lines.

The read decoder 40 selects one of the MOS transistors 340 to 370 in the selector SEL and supplies a voltage to the gate of the selected MOS transistor in a write and a read operation. Furthermore, the read decoder 40 applies a potential to the gate of the MOS transistor 21.

Since the remaining configuration is the same as that of the first embodiment, its explanation will be omitted. A plane pattern and a sectional structure of the memory cell block BLK are such that the two write global bit lines WGBL are eliminated and the read global bit line RGBL is replaced with a global bit line GBL in FIGS. 6A and 6B. Therefore, explanation of them will be omitted.

Next, the operation of the flash memory configured as described above will be explained. Since the operation is almost the same as that of the third embodiment, it will be explained briefly.

<Write Operation>

The data is written simultaneously into the memory cell blocks in the same row as in the first embodiment. In each memory cell block, the memory cells written into at the same time are only those connected to one of the local bit lines LBL0, LBL1.

In a write operation, the read decoder 40 turns on any one of the MOS transistors 340 to 370 in the selector SEL corresponding to the memory cell block BLK including the selected word line. As a result, the global bit line GBL is connected electrically to any one of the local bit lines LBL0 to LBL3.

Furthermore, the write decoder 30 turns off one of the MOS transistors 380 to 410 in the selector SEL corresponding to the memory cell block BLK including the selected word line and turns on the remaining MOS transistors. That is, only one local bit line is connected to the global bit line GBL via any one of the MOS transistors 340 to 370. Then, the write decoder 30 applies 0 V to all of the local bit lines not connected to the global bit line via any of the MOS transistors 380 to 410.

As a result, the global bit line GBL applies a voltage corresponding to "1" data or "0" data to any one of the local bit lines LBL0 to LBL3 in the memory cell block BLK including the selected word line via the MOS transistors 340 to 370 in the selector SEL. Consequently, as explained in the first embodiment, the data is written into the memory cell.

<Read Operation>

As in the first embodiment, the data is read simultaneously from a plurality of memory cells connected to any one of the word lines in such a manner that the data is read from one memory cell in each block.

In a read operation, the read decoder 40 turns on any one of the MOS transistors 340 to 370 in the selector SEL corresponding to the memory cell block BLK including the selected gate line. To read the data from the memory cells connected to the local bit lines LBL0 to LBL3 in a one-to-one correspondence, each of the MOS transistors 340 to 370 is turned on. As a result, the global bit line GBL is connected electrically to any one of the local bit lines LBL0 to LBL3.

The write decoder 30 turns off the MOS transistors 380 to 410 in the selector SEL.

As a result, in each memory cell block, the memory cell connected to any one of the local bit lines LBL0 to LBL3 is connected to the sense amplifier 70 via any one of the MOS transistors 340 to 370 and the global bit line GBL.

<Erase Operation>

Since an erase operation is the same as that in the first embodiment, its explanation will be omitted.

As described above, the flash memory of the fourth embodiment produces the effects described in items (1), (3), and (4) as in the first embodiment and the effect described in item (5) in the second embodiment.

Specifically, with the configuration of the fourth embodiment, in a memory cell block, a plurality of memory cells are connected to one local bit line and one memory cell block includes four local bit lines. Then, the four local bit lines included in one memory cell block are connected to one global bit line.

Then, in a write operation and in a read operation, only one memory cell block is connected electrically to one global bit line. Then, only one of the four local bit lines in the memory cell block is connected electrically to the global bit line.

As described above, in the fourth embodiment, too, the bit lines are organized in hierarchical form as in the first embodiment. Furthermore, the global bit lines are made of the metal wiring layer 250 located at the highest level. As a result, the effect of improving the operating speed of the flash memory in item (1) is attained.

In addition, organizing the bit lines in hierarchical form produces the effect of improving the reliability of a write operation in item (3).

The effect in item (4) is as explained in the first embodiment.

Furthermore, in the configuration of FIG. 9, one metal wiring layer 250 (or global bit line GBL) is formed in the region where four columns of memory cells are formed. Thus, it is possible to secure a wiring allowance in forming the metal wiring layer 250. As a result, the effect (5) of simplifying a flash memory manufacturing method is achieved.

Next, a nonvolatile semiconductor memory device according to a fifth embodiment of the present invention will be explained by reference to FIG. 10.

Figure 10:
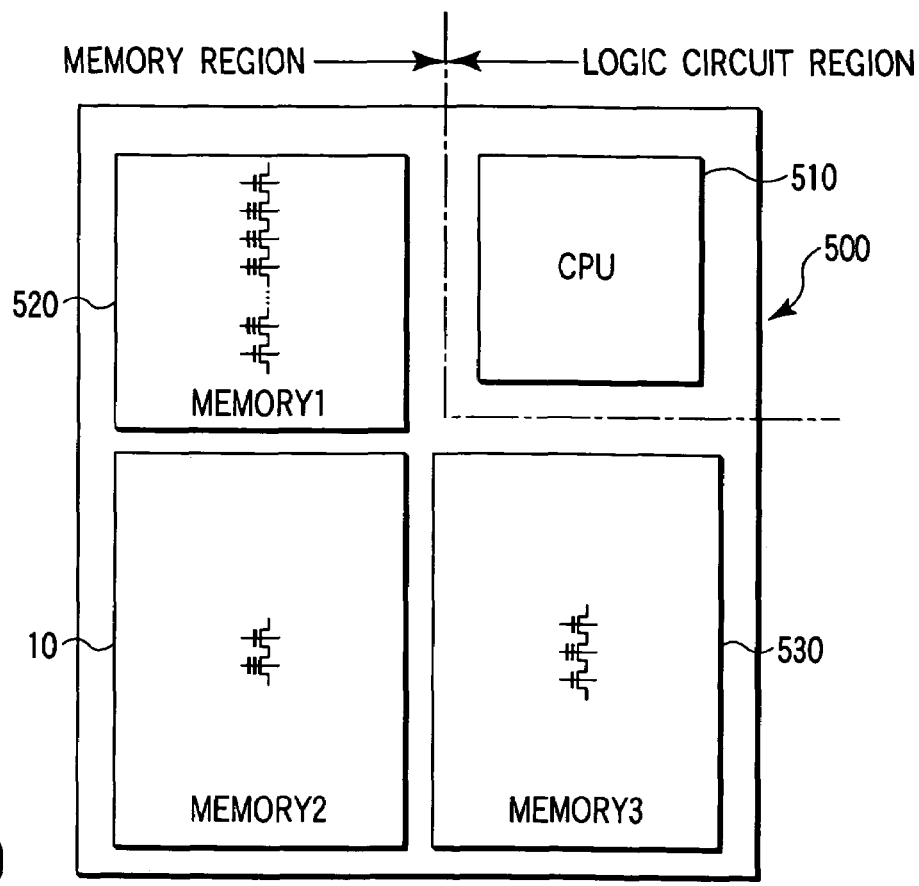
FIG. 10 is a block diagram of a system LSI including a flash memory according to a fifth embodiment of the present invention.

FIG. 10 is a block diagram of a system LSI including a nonvolatile semiconductor memory device according to the fifth embodiment.

As shown in FIG. 10, a system LSI 500 has a logic circuit region and a memory region. In the logic circuit region, for example, a CPU 510 is provided. In the memory region, a flash memory 10 explained in the first to fourth embodiments, a NAND flash memory 520, and a flash memory 530 where one memory cell includes three MOS transistors are provided.

With the configuration of the fifth embodiment, the flash memory 10 produces the effects described in items (1) to (5). In addition, the effect (6) of simplifying the manufacture of a system LSI is also achieved.

The flash memory 10 explained in the first to fourth embodiments can be formed in the same manufacturing processes as those of a NAND flash memory 520 and a flash memory 530. For instance, the process of implanting ions to form an impurity diffused layer, the process of patterning gate electrodes and metal wiring layers, and the like can be carried out at the same time for three types of flash memories. In this case, for example, the impurity diffused layers have the same impurity concentration in the individual memories. Since three flash memories provided in an LSI are formed in the same processes, the manufacture of LSIs can be simplified.

In the flash memory 10 according to the first to fourth embodiments, the number of transistors connected in series in a cell is two. For this reason, the current driving capability of a memory cell is greater than that of other memory cells. Therefore, the flash memory 10 is suitable for high-speed reading. As shown in FIG. 10, when it is provided on the same chip as that of the CPU 510, the flash memory 10 can be used as a ROM for storing the firmware for the CPU 510. In this respect, the flash memory 10 according to the first to fourth embodiments enables the data to be read from the flash memory at higher speed. This enables the CPU 510 to read the data directly from the flash memory 10 without using a RAM or the like, which makes a RAM unnecessary. This is helpful in configuring a system LSI.

In the logic circuit region, the CPU 510 may be formed on an SOI substrate. In the memory region, the individual memories 10, 520, 530 may be formed on a bulk silicon substrate.

As described above, in a nonvolatile semiconductor memory device according to the first to fifth embodiments, a plurality of memory cells are connected to local bit lines. A plurality of local bit lines are connected to global bit lines (write global bit line and read global bit line). That is, a hierarchical bit line system is used. This system reduces parasitic capacitance in the global bit lines remarkably in a write and a read operation. As a result, the operation of the flash memory can be made faster. In a write operation, it is possible to prevent the data effectively from being written into unselected memory cells erroneously.

Furthermore, the global bit lines are made of the metal wiring layer at the highest level. Thus, the wiring capacitance in the global bit lines is decreased, which improves the operating speed of the flash memory.

In addition, the source line is made of a metal wiring layer, which reduces the wiring resistance of the source line. As a result, the amount of current caused to flow through the memory cells can be increased, which improves the reliability of a read operation.

In the first and second embodiments, the global bit lines are divided into one for writing and one for reading. That is, the current path in a write operation differs from that in a read operation. Thus, low-withstand-voltage MOS transistors can be used as those in the current path in a read operation. As a result, the read operation can be made faster.

Furthermore, in the second to fourth embodiments, the wiring allowance for the metal wiring layer 250 can be secured, which simplifies the processes and improves the manufacturing yield.

In the first to fifth embodiments, the case where the latch circuit 60 outputs 0 V in writing "1" has been explained. Alternatively, the switch 63 may switch 0 V to Vcc (e.g., 1.5 V) as shown in FIG. 2. In this case, the potential difference between the gate and drain of the memory cell transistor becomes smaller, preventing erroneous writing more effectively, which improves the reliability of the write operation.

Figure 11A:
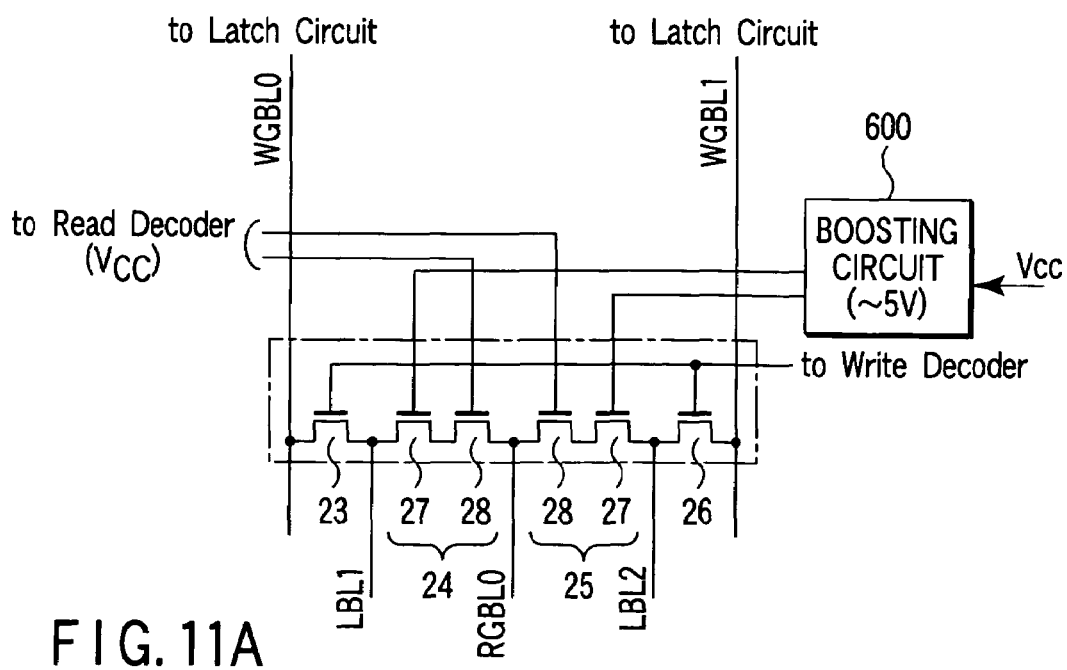
FIG. 11A is a circuit diagram of a selector included in a flash memory according to a modification of the first embodiment.
Figure 11B:
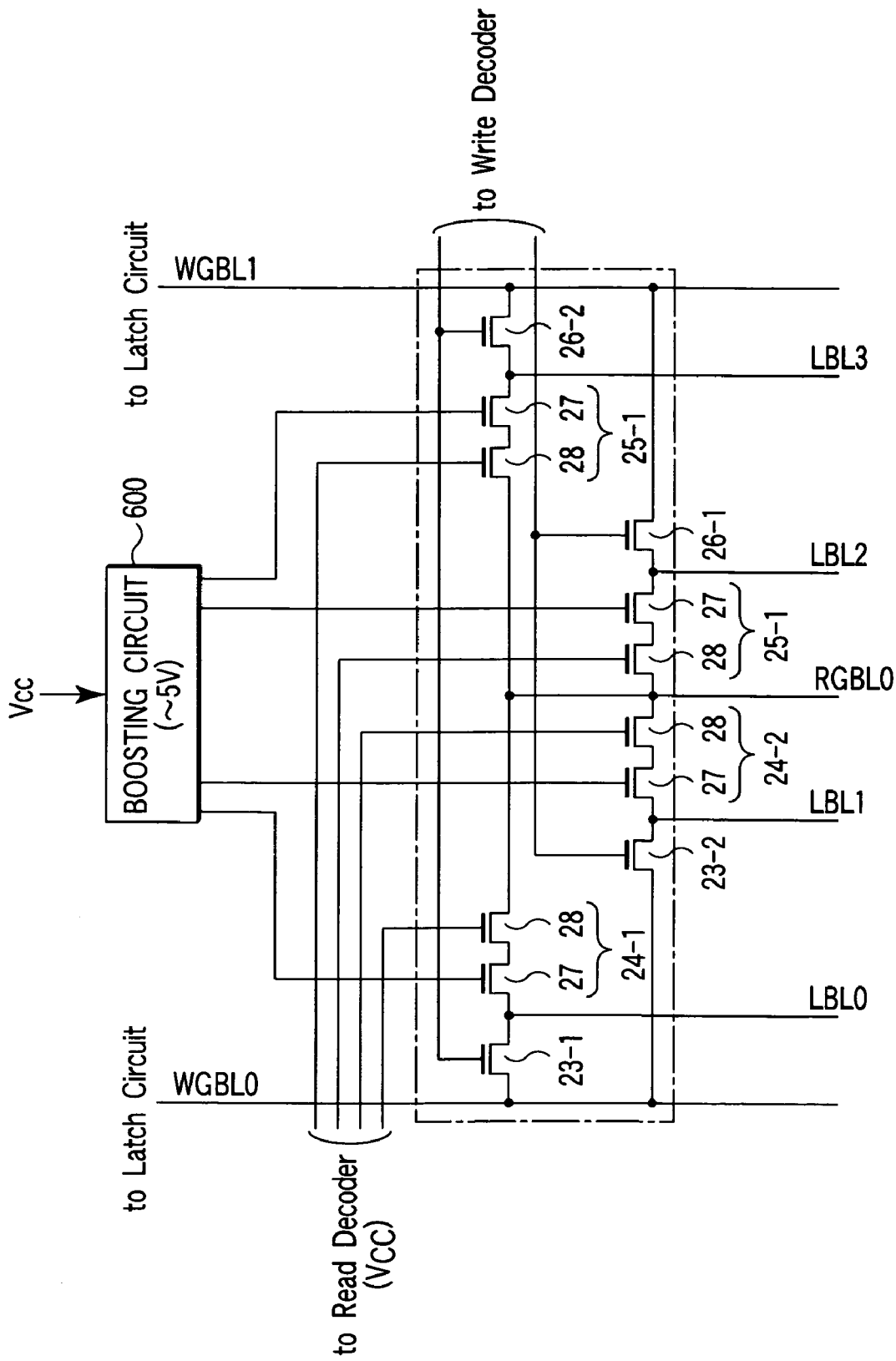
FIG. 11B is a circuit diagram of a selector included in a flash memory according to a modification of the second embodiment.

In the first and second embodiments, the MOS transistors 24, 25, 24-1, 24-2, 25-1, 25-2 may be replaced with two MOS transistors. FIGS. 11A and 11B are circuit diagrams of selectors according to modifications of the first and second embodiments.

As shown in the figures, each of the MOS transistors 24, 25, 24-1, 24-2, 25-1, 25-2 is replaced by two MOS transistors 27, 28 connected in series. Then, the MOS transistor 27 is connected to the local bit line and the MOS transistor 28 is connected to the read global bit line. The MOS transistor 28 is a low-withstand-voltage MOS transistor whose gate insulating film is thin. The MOS transistor 27 is a high-withstand-voltage MOS transistor whose gate insulating film is thick. Then, a boosting circuit 600 always applies, for example, 5 V to the gate of the MOS transistor 27. That is, the MOS transistor 27 does not carry out a switching operation. On the other hand, the gate of the MOS transistor 28 is connected to the read decoder 40. Then, using the voltage (e.g., Vcc) from the read decoder 40, the MOS transistor 28 carries out a switching operation.

With this configuration, the high-withstand-voltage MOS transistor 27 practically does not function as a switch element. The low-withstand-voltage MOS transistor 27 switches between the local bit line and the read global bit line. Thus, there is practically no high-withstand-voltage MOS transistor in the reading path, which enables a faster read operation and reduces the power consumption.

In the first and second embodiments, the bit lines are divided into the read global bit line and the write global bit line. In this case, it is desirable that the write global bit line should be set at the ground potential in a read operation. FIG. 12 is a circuit diagram of a memory cell block BLK and a selector SEL according to the first embodiment, which helps explain the division. As shown in the figure, in a read operation, the MOS transistor 24 is turned on and the local bit line LBL0 is connected to the read global bit line GBL0. Then, the write global bit lines WGBL0, WGBL1 are connected to a voltage generator 610 via a switch element 620. The voltage generator 610 applies 0 V to the write global bit lines WGBL0, WGBL1.

As described above, setting the potential of the write global bit line to the ground potential in a read operation serves as a measures against noise, which stabilizes the read operation more. While in FIG. 12, the case of the configuration of the first embodiment has been explained, the same holds true for the configuration of the second embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a plurality of memory cells each of which includes a first MOS transistor with a charge accumulation layer and a control gate and a second MOS transistor which has one end of its current path connected to one end of a current path of the first MOS transistor, the second MOS transistor in a selected one of the memory cells being turned on when data is read from the first MOS transistor in the selected one of the memory cells;
a plurality of local bit lines each of which connects other ends of the current paths of the first MOS transistors;
a global bit line to which two or more of the local bit lines are connected in common;
a first switch element which makes a connection between the local bit lines and the global bit line; and
a latch circuit which is connected to the global bit line and holds data to be written into the memory cells.

2. The semiconductor memory device according to claim 1, further comprising:
word lines each of which connects the control gates of plurality of the memory cells in common.

3. The semiconductor memory device according to claim 1, wherein
the data is written into the memory cells by exchanging electrons with the charge accumulation layer by FN tunneling.

4. The semiconductor memory device according to claim 1, further comprising:
a sense amplifier which amplifies read data, wherein
the global bit line includes a write global bit line and a read global bit line,
the first switch element includes a second switch which makes a connection between the write global bit line and the local bit lines and a third switch element which makes a connection between the read global bit line and the local bit lines, the latch circuit is connected to the write global bit line, and the sense amplifier is connected to the read global bit line.

5. The semiconductor memory device according to claim 4, wherein the third switch element includes a third MOS transistor which has one end of its current path connected to the local bit lines and the other end of its current path, and a fourth MOS transistor which has one end of its current path connected to the other end of the current path of the third MOS transistor, other end of its current path connected to the read global bit line and a gate insulating film thinner than that of the third MOS transistor.

6. The semiconductor memory device according to claim 4, wherein the potential of the write global bit line is set at the ground potential in a read operation.

7. The semiconductor memory device according to claim 1, further comprising:

a sense amplifier which is connected to one end of the global bit line and amplifies read data; and a third MOS transistor which has one end of its current path connected to the connection node of the local bit lines and the first switch element and the other end of its current path connected to a first potential, wherein the latch circuit is connected to the other end of the global bit line, and the gates of the third MOS transistors connected to the local bit lines sharing the global bit line are independent of one another.

8. The semiconductor memory device according to claim 1, further comprising:

a source line to which the other ends of the current paths of the second MOS transistors in the memory cells are connected in common; and a source line driver which supplies a potential to the source line.

9. The semiconductor memory device according to claim 1, wherein a negative voltage is applied to the local bit lines in a write operation and a negative voltage is applied to the control gate of the first MOS transistor in an erase operation.

10. The semiconductor memory device according to claim 1, further comprising:

a plurality of cell blocks including two columns of the memory cells connected to two of the local bit lines respectively; and a sense amplifier which amplifies the data read from the memory cells, wherein each of the global bit lines includes two write global bit lines and one read global bit line, the first switch element includes a second and a third switch element, and in each of the cell blocks, two of the local bit lines are connected to the two write global bit lines via the second switch respectively and are connected to the one read global bit line via the third switch element in common, the latch circuit is connected to each of the write global bit lines, and the sense amplifier is connected to each of the read global bit lines.

11. The semiconductor memory device according to claim 1, further comprising:

a plurality of cell blocks including four columns of the memory cells connected to four of the local bit lines respectively; and a sense amplifier which amplifies the data read from the memory cells, wherein each of the global bit lines includes two write global bit lines and one read global bit line, the first switch element includes a second and a third switch element, and in each of the cell blocks, two of the local bit lines are connected in common to one of the write global bit lines via the second switch element, the remaining two local bit lines are connected in common to the other of the write global bit lines via the second switch element, and the read global bit line is connected to all of the four local bit lines via the third switch element, the latch circuit is connected to each of the write global bit lines, and the sense amplifier is connected to each of the read global bit lines.

12. The semiconductor memory device according to claim 1, further comprising:

a plurality of cell blocks including two columns of the memory cells connected to two of the local bit lines respectively;

a second switch element which is provided for each of the cell blocks and makes a connection between the two local bit lines and a first potential node; and a sense amplifier which amplifies the data read from the memory cells, wherein in each of the cell blocks, two of the local bit lines are connected in common to the global bit line via the first switch and, in a write operation, one of the local bit lines is connected to the global bit line by the first switch and disconnected from the first potential node by the second switch and the other of the local bit lines is connected to the first potential node by the second switch and disconnected from the global bit line by the first switch, and in a read operation, one of the local bit lines is connected to the global bit line by the first switch and the other of the local bit lines is disconnected from the global bit line by the first switch, and the latch circuit is connected to one end of the global bit line and the sense amplifier is connected to the other end of the global bit line.

13. The semiconductor memory device according to claim 1, further comprising:

a plurality of cell blocks including four columns of the memory cells connected to four of the local bit lines respectively;

a second switch element which is provided for each of the cell blocks and makes a connection between the four local bit lines and a first potential node; and a sense amplifier which amplifies the data read from the memory cells, wherein in each of the cell blocks, four of the local bit lines are connected in common to the global bit line via the first switch and, in a write operation, any one of the local bit lines is connected to the global bit line by the first switch and disconnected from the first potential node by the second switch and the remaining three local bit lines are connected to the first potential node by the second switch and disconnected from the global bit line by the first switch, and in a read operation, any one of the local bit lines is connected to the global bit line by the first switch and the remaining three local bit lines are disconnected from the global bit line by the first switch, and the latch circuit is connected to one end of the global bit line and the sense amplifier is connected to the other end of the global bit line.

14. The semiconductor memory device according to claim 1,
wherein the global bit line is made of a metal wiring layer located at the highest level in a memory cell array which has the memory cells arranged in a matrix.

15. A semiconductor memory device comprising:
a plurality of memory cells each of which includes a first MOS transistor with a charge accumulation layer and a control gate and a second MOS transistor which has one end of its current path connected to one end of a current path of the first MOS transistor, the second MOS transistor in a selected one of the memory cell being turned on when data is read from the first MOS transistor in the selected one of the memory cells;
word lines to which the control gates of two or more of the memory cells are connected in common, the data being written into two or more of the memory cells connected to the same word line at the same time by exchanging electrons with the charge accumulation layer by FN tunneling;
a plurality of local bit lines to which the other end of the current path of the first MOS transistor of each of two or more of the memory cells is connected;
a global bit line to which two or more of the local bit lines are connected in common;
a first switch element which makes a connection between the local bit lines and the global bit line; and
a latch circuit which is connected to the global bit line and holds data to be written into the memory cells.

16. The semiconductor memory device according to claim 15, further comprising:
a sense amplifier which amplifies read data, wherein
the global bit line includes a write global bit line and a read global bit line,
the first switch element includes a second switch which makes a connection between the write global bit line and the local bit lines and a third switch element which makes a connection between the read global bit line to the local bit lines,
the latch circuit is connected to the write global bit line, and
the sense amplifier is connected to the read global bit line.

17. The semiconductor memory device according to claim 16,
wherein the third switch element includes a third MOS transistor which has one end of its current path connected to the local bit lines and the other end of its current path, and
a fourth MOS transistor which has one end of its current path connected to the other end of the current path of the third MOS transistor, the other end of the current path connected to the read global bit line and a gate insulating film thinner than that of the third MOS transistor.

18. The semiconductor memory device according to claim 16, wherein the potential of the write global bit line is set at the ground potential in a read operation.

19. The semiconductor memory device according to claim 15, further comprising:
a sense amplifier which is connected to one end of the global bit line and amplifies read data; and
a third MOS transistor has one end of its current path connected to the connection node of the local bit lines and the first switch element and the other end of its current path connected to a first potential, wherein
the latch circuit is connected to the other end of the global bit line, and
the gates of the third MOS transistors connected to the local bit lines sharing the global bit line are independent of one another.

20. The semiconductor memory device according to claim 15, further comprising:
a source line to which the other ends of the current paths of the second MOS transistors in the memory cells are connected in common; and
a source line driver which supplies a potential to the source line.

21. The semiconductor memory device according to claim 15, wherein a negative voltage is applied to the local bit lines in a write operation and a negative voltage is applied to the control gate of the first MOS transistor in an erase operation.

22. The semiconductor memory device according to claim 15, further comprising:
a plurality of cell blocks including two columns of the memory cells connected to two of the local bit lines respectively; and
a sense amplifier which amplifies the data read from the memory cells, wherein
each of the global bit lines includes two write global bit lines and one read global bit line,
the first switch element includes a second and a third switch element, and
in each of the cell blocks, two of the local bit lines are connected to the two write global bit lines via the second switch element respectively, and the read global bit line is connected via the third switch element to the two local bit lines,
the latch circuit is connected to each of the write global bit lines, and
the sense amplifier is connected to each of the read global bit lines.

23. The semiconductor memory device according to claim 15, further comprising:
a plurality of cell blocks including four columns of the memory cells connected to four of the local bit lines respectively; and
a sense amplifier which amplifies the data read from the memory cells, wherein
each of the global bit lines includes two write global bit lines and one read global bit line,
the first switch element includes a second and a third switch element, and
in each of the cell blocks, two of the local bit lines are connected in common to one of the write global bit lines via the second switch element, the remaining two local bit lines are connected in common to the other of the write global bit lines via the second switch element, and the read global bit line is connected to all of the four local bit lines via the third switch element,
the latch circuit is connected to each of the write global bit lines, and
the sense amplifier is connected to each of the read global bit lines.

24. The semiconductor memory device according to claim 15, further comprising:
a plurality of cell blocks including two columns of the memory cells connected to two of the local bit lines respectively;
a second switch element which is provided for each of the cell blocks and makes a connection between the two local bit lines and a first potential node; and
a sense amplifier which amplifies the data read from the memory cells, wherein in each of the cell blocks, two of the local bit lines are connected in common to the global bit line via the first switch and, in a write operation, one of the local bit lines is connected to the global bit line by the first switch and disconnected from the first potential node by the second switch and the other of the local bit lines is connected to the first potential node by the second switch and disconnected from the global bit line by the first switch, and in a read operation, one of the local bit lines is connected to the global bit line by the first switch and the other of the local bit lines is disconnected from the global bit line by the first switch, and the latch circuit is connected to one of the global bit line and the sense amplifier is connected to the other end of the global bit line.

25. The semiconductor memory device according to claim 15, further comprising:
a plurality of cell blocks including four columns of the memory cells connected to four of the local bit lines respectively;
a second switch element which is provided for each of the cell blocks and makes a connection between the four local bit lines and a first potential node; and
a sense amplifier which amplifies the data read from the memory cells, wherein
in each of the cell blocks, four of the local bit lines are connected in common to the global bit line via the first switch and, in a write operation, any one of the local bit lines is connected to the global bit line by the first switch and disconnected from the first potential node by the second switch and the remaining three local bit lines are connected to the first potential node by the second switch and disconnected from the global bit line by the first switch, and in a read operation, any one of the local bit lines is connected to the global bit line by the first switch and the remaining three local bit lines are disconnected from the global bit line by the first switch, and
the latch circuit is connected to one of the global bit line and the sense amplifier is connected to the other end of the global bit line.

26. The semiconductor memory device according to claim 15, wherein the global bit line is made of a metal wiring layer located at the highest level in a memory cell array which has the memory cells arranged in a matrix.

27. A semiconductor memory device comprising:
a plurality of memory cells each of which includes a first MOS transistor with a charge accumulation layer and a control gate and a second MOS transistor which has one end of its current path connected to one end of a current path of the first MOS transistor, the second MOS transistor in a selected one of the memory cells being turned on when data is read from the first MOS transistor in the selected one of the memory cells;
a plurality of cell blocks in each of which the memory cells are arranged in a matrix;
a memory cell array which has the cell blocks arranged in a matrix;
a plurality of local bit lines to which the other ends of the current paths of the first MOS transistors of the memory cells in the same column are connected in common in each of the cell blocks;
a plurality of global bit lines to which the local bit lines in the same column are connected in common in the memory cell array;
a first switch element which makes a connection between the local bit lines and the global bit lines; and
a latch circuit which is connected to each of the global bit lines and holds data to be written into the memory cells.

28. The semiconductor memory device according to claim 27, further comprising:
word lines to which the control gates of the memory cells in the same row are connected in common.

29. The semiconductor memory device according to claim 27, wherein the data is written into the memory cells by exchanging electrons with the charge accumulation layer by FN tunneling.

30. The semiconductor memory device according to claim 27, further comprising:
a sense amplifier which amplifies read data, wherein
the global bit lines include write global bit lines and read global bit lines,
the first switch element includes a second switch which makes a connection between the write global bit lines and the local bit lines and a third switch element which makes a connection between the read global bit lines and the local bit lines,
the latch circuit is connected to the write global bit lines, and
the sense amplifier is connected to the read global bit lines.

31. The semiconductor memory device according to claim 30, wherein the third switch element includes a third MOS transistor which has one end of its current path connected to the local bit lines and the other end of its current path, and
a fourth MOS transistor which has one end of its current path connected to the other end of the current path of the third MOS transistor, the other end of its current path connected to the read global bit lines and a gate insulating film thinner than that of the third MOS transistor.

32. The semiconductor memory device according to claim 30, wherein the potential of the write global bit line is set at the ground potential in a read operation.

33. The semiconductor memory device according to claim 27, further comprising:
a sense amplifier which is connected to one end of the global bit line and amplifies read data; and
a third MOS transistor has one end of its current path connected to the connection node between the local bit lines and the first switch element and the other end of its current path connected to a first potential, wherein
the latch circuit is connected to the other end of the global bit line, and
the gates of the third MOS transistors connected to the local bit lines sharing the global bit line are independent of one another.

34. The semiconductor memory device according to claim 27, further comprising:
a source line to which the other ends of the current paths of the second MOS transistors in the memory cells are connected in common; and
a source line driver which supplies a potential to the source line.

35. The semiconductor memory device according to claim 27, wherein a negative voltage is applied to the local bit lines in a write operation and a negative voltage is applied to the control gate of the first MOS transistor in an erase operation.

36. The semiconductor memory device according to claim 27, wherein the global bit lines are made of a metal wiring layer located at the highest level in the memory cell array which has the memory cells arranged in a matrix.

* * * * *